United States Patent
Nishihara et al.

[11] Patent Number: 6,131,257
[45] Date of Patent: *Oct. 17, 2000

[54] METHOD OF MAKING A SURFACE ACOUSTIC WAVE DEVICE

[75] Inventors: Tokihiro Nishihara; Takashi Matsuda; Hidema Uchishiba; Osamu Ikata; Yoshio Satoh; Kazunari Komenou, all of Kawasaki, Japan

[73] Assignee: Fujitsu Limited, Kawasaki, Japan

[*] Notice: This patent issued on a continued prosecution application filed under 37 CFR 1.53(d), and is subject to the twenty year patent term provisions of 35 U.S.C. 154(a)(2).

[21] Appl. No.: 09/004,273

[22] Filed: Jan. 8, 1998

Related U.S. Application Data

[62] Division of application No. 08/615,798, Mar. 14, 1996, Pat. No. 5,796,205, which is a continuation of application No. 08/290,639, Aug. 16, 1994, abandoned.

[30] Foreign Application Priority Data

Nov. 25, 1993 [JP] Japan ..................... 5-295202
Dec. 20, 1993 [JP] Japan ..................... 5-320314
Jun. 30, 1994 [JP] Japan ..................... 6-150228

[51] Int. Cl.[7] ............................................ H01L 41/22
[52] U.S. Cl. ................................ 29/25.35; 310/313 R
[58] Field of Search ..................... 29/25.35; 310/313 R, 310/313 A, 313 D

[56] References Cited

U.S. PATENT DOCUMENTS

| | | | |
|---|---|---|---|
| 3,568,079 | 3/1971 | Yoder | 330/5.5 |
| 4,060,777 | 11/1977 | Tiersten et al. | 333/72 |
| 4,353,046 | 10/1982 | Hartmann . | |
| 4,499,393 | 2/1985 | Stokes et al. . | |
| 4,597,824 | 7/1986 | Shinada et al. | 156/643 |
| 4,683,395 | 7/1987 | Matsutsuka . | |
| 4,706,239 | 11/1987 | Ito et al. . | |
| 4,949,144 | 8/1990 | Kuroda et al. | 357/30 |
| 5,114,868 | 5/1992 | Yoshida | 437/34 |
| 5,115,216 | 5/1992 | Hikita et al. . | |
| 5,294,858 | 3/1994 | Nakahata et al. | 310/313 A |
| 5,322,810 | 6/1994 | Ayukawa et al. | 437/41 |
| 5,346,841 | 9/1994 | Yajima | 437/35 |
| 5,399,506 | 3/1995 | Tsukamoto | 437/19 |
| 5,576,589 | 11/1996 | Dreifus et al. | 310/313 A |

FOREIGN PATENT DOCUMENTS

| | | |
|---|---|---|
| 48-26452 | 4/1973 | Japan . |
| 52-16146 | 2/1977 | Japan . |
| 52-119849 | 10/1977 | Japan . |
| 63-169806 | 7/1988 | Japan . |
| 2-272817 | 11/1990 | Japan . |
| 61-12764 | 4/1994 | Japan . |

OTHER PUBLICATIONS

Patent Abstracts of Japan, vol. 17, No. 434 (E–1412) Aug. 11, 1993 of JP–A–05 090893 (Sumitomo Electric Ind Ltd) Apr. 9, 1993.
IEEE 1987 Ultrasonics Symposium, vol. 1, Oct. 1987, pp. 43–46.

*Primary Examiner*—Carl E. Hall
*Attorney, Agent, or Firm*—Armstrong, Westerman, Hattori, McLeland & Naughton

[57] ABSTRACT

A method of producing a SAW (Surface Acoustic Wave) device, including the steps of implanting ions in an entire surface of a piezoelectric member of the SAW device, so that an ion implantation layer is formed therein; performing a heat treatment of the piezoelectric member, so that a heat-treated ion implantation layer is formed in the entire surface of the piezoelectric member; and providing an electrode of a comb type resonator on the heat-treated ion implantation layer.

11 Claims, 17 Drawing Sheets

FIG. 7A
FIG. 7B
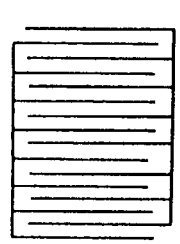
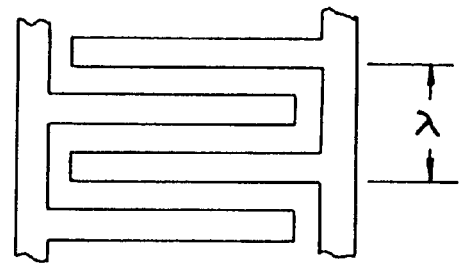
FIG. 8A
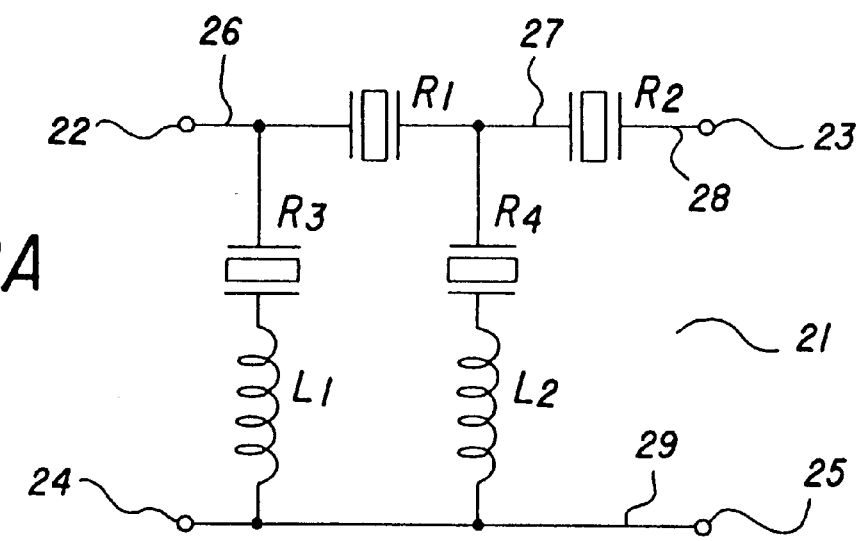
FIG. 8B
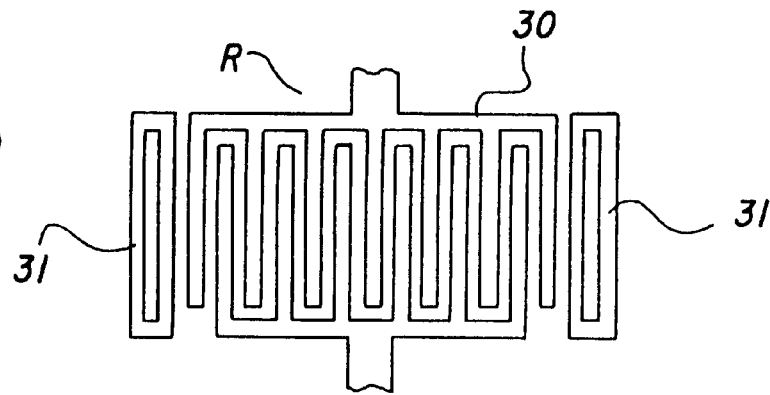

$L_1 = L_2 = L_3 = 4nH$

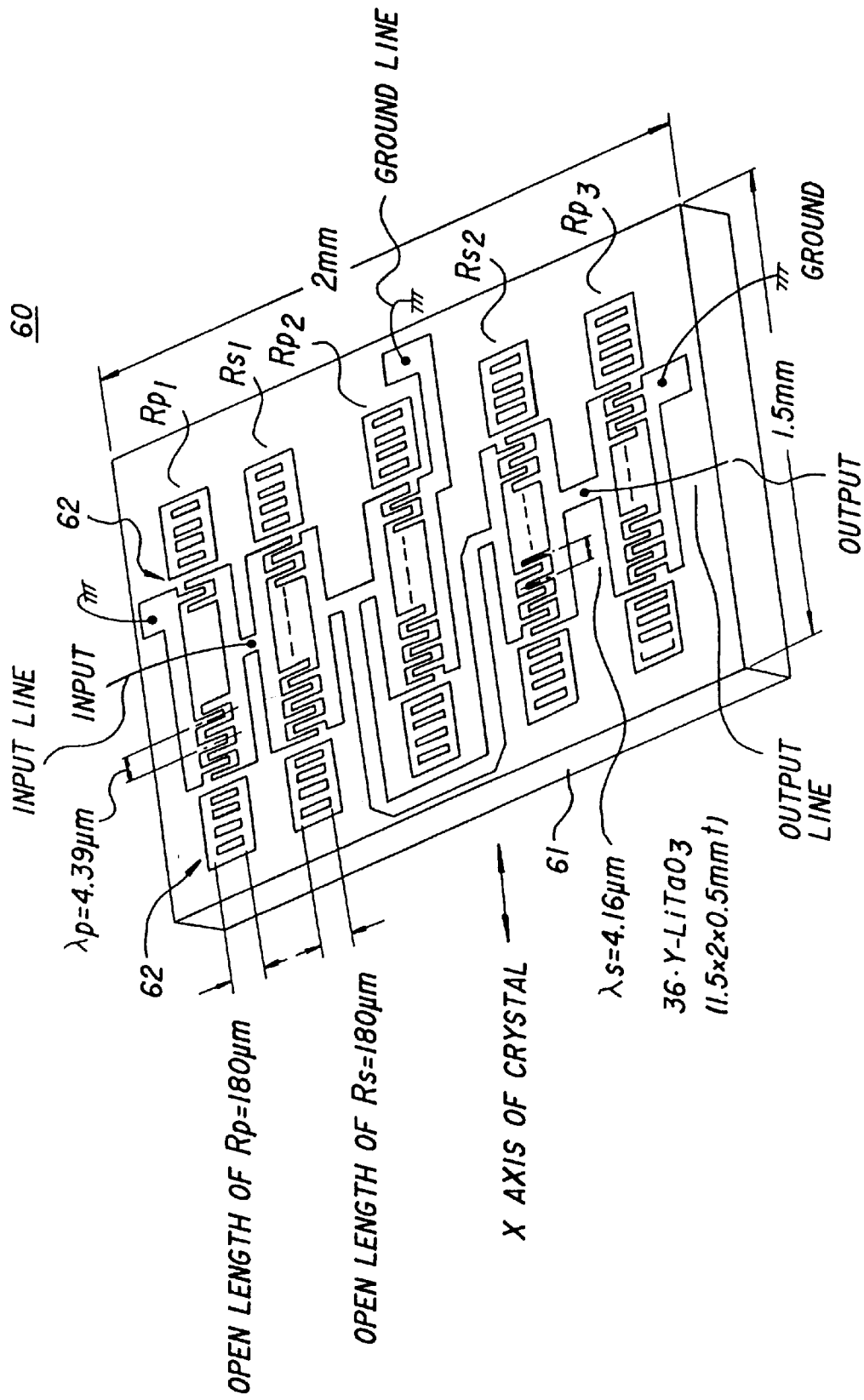

ducing a SAW device. The method involves the steps of:

METHOD OF MAKING A SURFACE ACOUSTIC WAVE DEVICE

Division of prior application No. 08/615,798, filed Mar. 14, 1996, now U.S. Pat. No. 5,796,205, which is a continuing application of application No. 08/290,639 filed Aug. 16, 1994, abandoned

BACKGROUND OF THE INVENTION

1. Field of the Invention

The present invention relates to surface acoustic wave devices which utilizes a surface acoustic wave propagating through a surface of a piezoelectric substrate or a surface of a piezoelectric thin film provided on a predetermined base.

Recently, down-sizing of mobile communications devices such as portable telephone sets has been facilitated progressively, and there has been a demand for down-sizing of parts and improvements in the performance thereof. Normally, these communications devices are equipped with elements such as an oscillator, filter and a wave distributing element used to generate and branch a signal. Recently, there has been considerable activity in the research and development of devices using a surface acoustic wave in order to facilitate down-sizing of the above elements. Particularly, a surface acoustic wave filter in which an inductance is added to a surface acoustic wave resonator equipped with a reflector has a low insertion loss, and enables broadening of the band and high suppression performance. Hence, applications of such a surface acoustic wave filter to the next-generation automobile telephone sets and portable telephone sets have been considered.

2. Description of the Related Art

Surface acoustic wave (hereinafter simply referred to as SAW) devices use a surface acoustic wave that propagates through a surface of a dielectric body cut out of a piezoelectric crystal or a surface of a piezoelectric thin film. It is possible to control (adjust) characteristics of such SAW devices such as the central frequency and the pass-band range by changing the propagation speed of the SAW and/or the electromechanical coupling factor. The following first through third methods are known as means for controlling the characteristics of the SAW devices.

The first method is to select an appropriate piezoelectric crystal material, an appropriate cut surface of the crystal and/or the SAW propagating direction. For example, a crystal material such as $LiNbO_3$ or $LiTaO_3$ is used, and the X-112° cut or 36° Y-X cut surface of the $LiTaO_3$ crystal is used.

The second method is shown in FIG. 1A. As shown in FIG. 1A, the second method is to provide an insulating film 3 between the surface of a piezoelectric substrate 1 (or the surface of a piezoelectric thin film) and a comb-type electrode 2 (see Japanese Laid-Open Patent Application No. 48-26452 or No. 52-16146). FIG. 1B shows a variation of the second method. In FIG. 1B, an insulating film 4 is formed on the surface of the piezoelectric substrate 1 (or the surface of the piezoelectric thin film) on which the comb-type electrode 2 is formed.

The third method is shown in FIG. 1C, in which an ion implantation layer 5 containing Ar, $O_2$ or Si ions is formed in the surface of the piezoelectric substrate (or the surface of the piezoelectric thin film). The third method is disclosed in, for example, Japanese Laid-Open Patent Application No. 63-169806.

The first method changes not only the SAW propagation speed and the electromechanical coupling factor but also the SAW mode and the temperature coefficient of the SAW device. Hence, it is very difficult to optimize these parameters and thus produce devices having the desired characteristics.

The second method shown in FIG. 1A has a disadvantage found by an experiment conducted by the inventors. In the experiment, the insulating film 3 made of $SiO_2$ (which is the most general insulating material) was formed between the surface of the piezoelectric substrate 1 and the comb-type electrode 2. FIG. 2 shows the result of the experiment, in which the horizontal axis denotes the thickness of the $SiO_2$ insulating film 3 and the vertical axis denotes the electromechanical coupling factor $k^2$ (%). The electromechanical coupling factor greatly depends on the thickness of the $SiO_2$ film 3, particularly when the thickness of the $SiO_2$ film 3 is equal or less than 1000 Å. In other words, the value of the electromechanical coupling factor changes greatly due to even a small variation in the thickness of the $SiO_2$ film 3, and barely changes when the thickness of the $SiO_2$ film is greater than 1000 Å. Hence, the setting of the thickness of the $SiO_2$ film is very difficult. Further, absorption and damping of the SAW are caused by the $SiO_2$ film, and hence there is a large insertion loss of a SAW device to which the second method is applied.

The variation of the second method shown in FIG. 1B has disadvantages similar to those of the second method.

The third method has a disadvantage in that the SAW propagation speed is changed by the thermal history resulting from a process carried out after the third method. Hence, the third method does not have good reliability, and the insertion loss of a SAW device to which the third method is applied is not negligible.

SUMMARY OF THE INVENTION

It is a general object of the present invention to provide a SAW device and method of producing the same in which the above disadvantages are eliminated.

A more specific object of the present invention is to provide a SAW device and method in which various parameters of the SAW device such as the SAW propagation speed and the electromechanical coupling factor can be easily controlled and there is a reduced insertion loss.

The above objects of the present invention are achieved by a SAW (Surface Acoustic Wave) device comprising: a piezoelectric member; a heat-treated ion implantation layer formed in a surface portion of the piezoelectric member; and an electrode of a comb type resonator with reflectors provided on the heat-treated ion implantation layer.

The above objects of the present invention are also achieved by a method of producing a SAW (Surface Acoustic Wave) device, the step comprising the steps of: a) implanting ions in a surface portion of a piezoelectric member of the SAW device, so that an ion implantation layer is formed therein; b) performing a heat treatment of the piezoelectric member, so that a heat-treated ion implantation layer is formed in the surface portion of the piezoelectric member; and c) providing an electrode of a comb type resonator on the heat-treated ion implantation layer.

The above objects of the present invention are also achieved by a SAW (Surface Acoustic Wave) device comprising: a first resonator formed on a piezoelectric member and provided in a parallel arm;

and a second resonator formed on the piezoelectric member and provided in a series arm, the first resonator having a resonance frequency approximately equal to an anti-resonance frequency of the second resonator, the piezoelectric member including an ion implantation layer formed in a surface portion of the piezoelectric member on which at least one of the first resonator and the second resonator is provided.

The above objects of the present invention are also achieved by a method of producing a SAW (Surface Acoustic Wave) device including a first resonator formed on a piezoelectric member and provided in a parallel arm, and a second resonator formed on the piezoelectric member and provided in a series arm, the first resonator having a resonance frequency approximately equal to an anti-resonance frequency of the second resonator, the method comprising the steps of: a) implanting ions in a surface portion of the piezoelectric member so that an ion implantation layer is formed therein; and b) forming electrodes of a comb type of the first and second resonators on the piezoelectric member so that at least one of the first and second resonators is provided on the ion implantation layer.

BRIEF DESCRIPTION OF THE DRAWINGS

Other objects, features and advantages of the present invention will become more apparent from the following detailed description when read in conjunction with the accompanying drawings, in which:

FIGS. 7A and 7B are diagrams for explaining a pitch of a comb-type electrode having a resonator structure;

FIG. 8A is an equivalent circuit diagram of a structure shown in FIG. 17;

FIG. 8B is a diagram of an electrode used in each resonator shown in FIG. 17;

FIG. 27 is a perspective view of another practical example of the SAW filter according to the present invention.

DESCRIPTION OF THE PREFERRED EMBODIMENTS

A description will now be given, with reference to FIGS. 3A through 3D, of a first embodiment of the present invention.

Figure 1A:
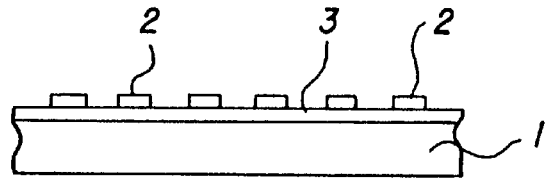
FIGS. 1A, 1B and 1C are cross-sectional views of conventional methods for controlling the SAW propagation speed and the electromechanical coupling factor.
Figure 1B:
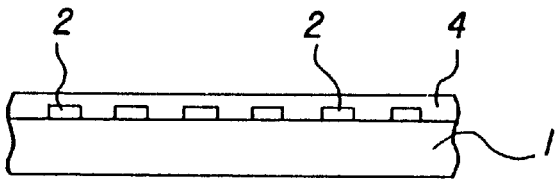
Figure 1C:
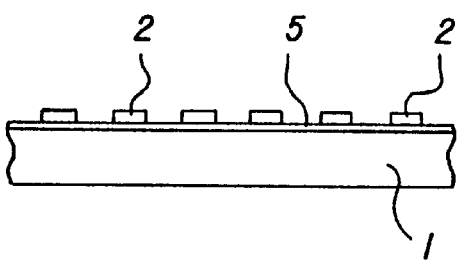
Figure 2:
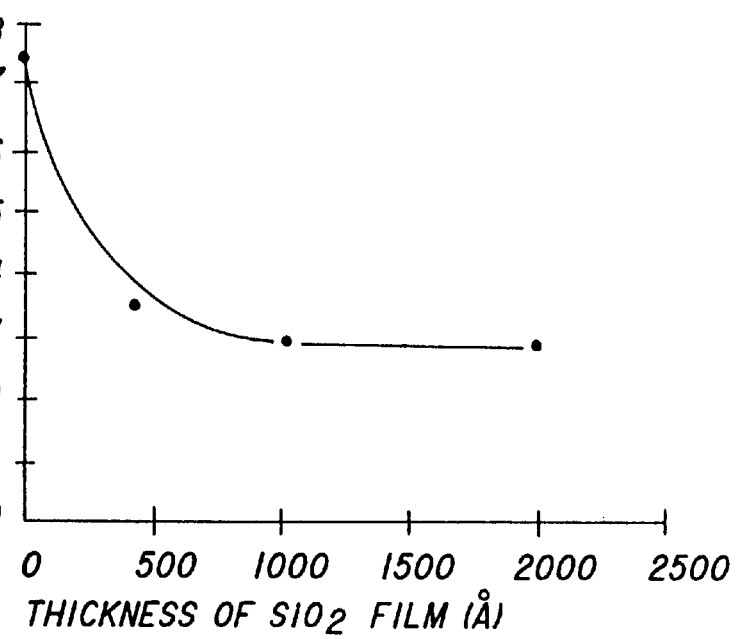
FIG. 2 is a graph of a relationship between the electromechanical coupling factor and the thickness of an $SiO_2$ film shown in FIG. 1A.
Figure 3A:
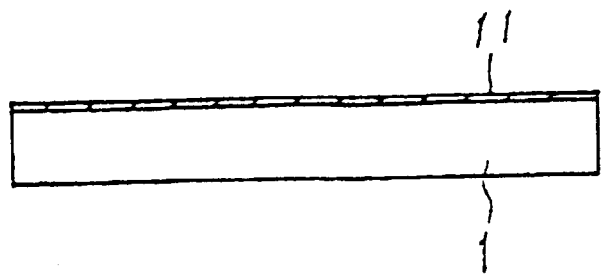
FIGS. 3A, 3B, 3C and 3D are cross-sectional views of a first embodiment of the present invention.

Referring to FIG. 3A, a substance for controlling the SAW propagation speed and the electromechanical coupling factor is ion-implanted in a surface portion of a piezoelectric substrate (or a piezoelectric thin film formed on a predetermined base) 1, so that an ion implantation layer 11 is formed in the surface portion of the piezoelectric substrate 1. Examples of such a substance is boron (B), argon (Ar), fluorine (F), neon (Ne), hydrogen (H) or phosphorus (P).

Figure 3B:
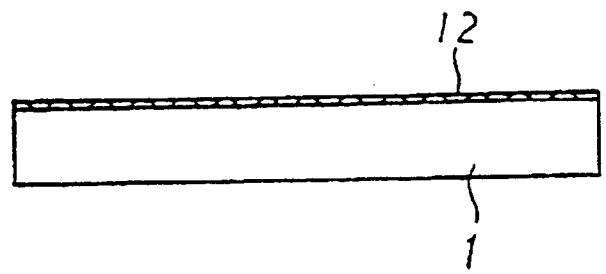

Next, a heat treatment (annealing) for controlling the SAW propagation speed and the electromechanical coupling factor, so that a heat treatment layer 12 for the ion implantation layer 11 is formed, as shown in FIG. 3B. For example, the heat treatment heats the piezoelectric substrate 1 at 350° C. for 30 minutes in vacuum.

Figure 3C:
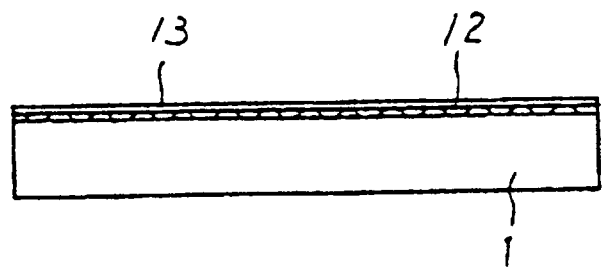
Figure 3D:
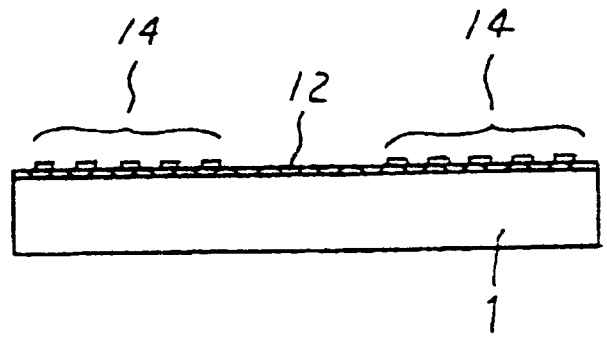

Then, as shown in FIG. 3C, a metallic layer 13 is coated on the heat treatment layer 12. Thereafter, as shown in FIG. 3D, unnecessary portions of the metallic layer 13 are removed, so that comb-type electrodes (interdigital electrodes) 14 having the function of generating a surface acoustic wave and outputting an electric signal corresponding to a surface acoustic wave are defined on the surface of the heat treatment layer 12.

The first embodiment of the present invention will be further described with reference to FIGS. 4, 5, 6A and 6B.

Figure 4:
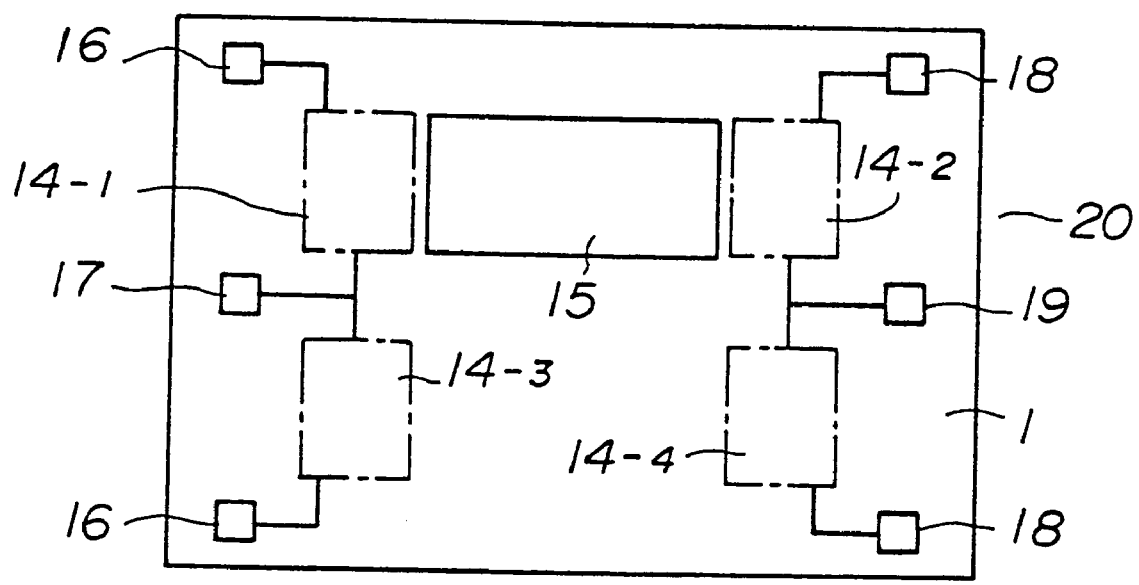
FIG. 4 is a plan view of a SAW device sample used to measure the surface acoustic velocity of a surface acoustic wave.

FIG. 4 shows a sample 20 used to measure the SAW propagation speed (surface acoustic velocity). The sample 20 has the substrate 1 cut out of a $LiTaO_3$ crystal. Interdigital electrodes $14_1$, $14_2$, $14_3$ and $14_4$ and a metallic pattern 15 are formed on the surface of the substrate 1. The metallic pattern 15 is interposed between the opposite electrodes $14_1$ and $14_2$.

The interdigital electrodes $14_1$, $14_2$, $14_3$ and $14_4$ and the metallic pattern 15 are approximately 3000 Å thick, and are defined by patterning an Al-Cu film by the photolithograph technique. Each of the interdigital electrodes $14_1$, $14_2$, $14_3$ and $14_4$ includes a pair of electrodes of a comb-type resonator as shown in FIG. 7A, and the pitch of the adjacent finger portions is a predetermined value as shown in FIG. 7B. Input terminals 16 are respectively connected to the interdigital electrodes $14_1$ and $14_3$, which function as input electrodes. A ground terminal 17 is connected in common to the interdigital electrodes $14_2$ and $14_4$. Output terminals 18 are respectively connected to the electrodes $14_2$ and $14_4$, which function as output lectrodes. A ground terminal 19 is connected in common to the interdigital electrodes $14_2$ and $14_4$.

In the measurement of the SAW propagation speed, the following four different samples were prepared. The first sample had the piezoelectric substrate 1 in which no ions were implanted. The second sample had the piezoelectric substrate 1 in which boron ions were implanted at 180 keV and a dose of $1 \times 10^{14}$ ions/cm$^2$. The third sample was formed by applying a heat treatment to the second sample in which the second sample was heated at 200° C. for 10 minutes in a vacuum of approximately $2 \times 10^{-8}$ Torr. The fourth sample was formed by applying a heat treatment to the second sample in which the second sample was heated at 350° C. for 30 minutes in a vacuum of $2 \times 10^{-8}$ Torr. Then, the interdigital electrodes $14_1$, $14_2$, $13_3$ and $14_4$ and the metallic pattern 15 were formed on the first through fourth samples under the same condition.

Figure 5:
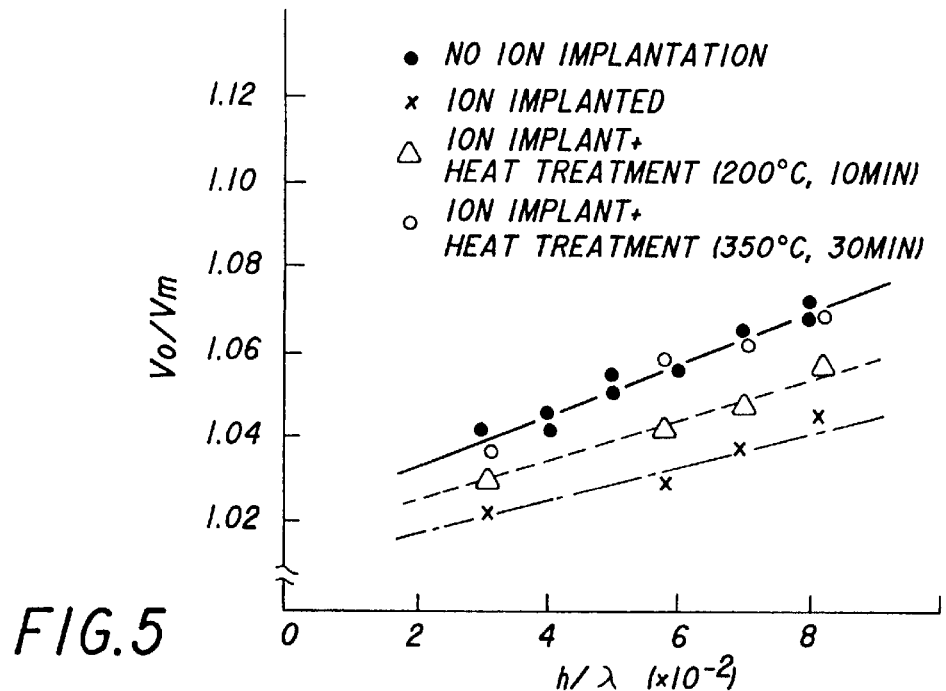
FIG. 5 is a graph of SAW propagation speeds of four samples each having the structure shown in FIG. 4.

FIG. 5 is a graph of the SAW propagation speeds of the four samples, in which the horizontal axis denotes h/λ where h is the thickness of the metallic layer 15 and λ is the electrode pitch of the interdigital electrodes $14_1$, $14_2$, $13_3$ and $14_4$, and the vertical axis denotes Vo/Vm where Vm is the surface acoustic velocity between the interdigital electrodes $14_1$ and $14_2$ under metal and Vo is the surface acoustic velocity between the interdigital electrodes $14_3$ and $14_4$ on free surface.

In FIG. 5, symbol "·" denotes plotted measured values of the SAW propagation speed of the first sample, and symbol "×" denotes plotted measured values of the SAW propagation speed of the second sample. Symbol "Δ" denotes plotted measured values of the SAW propagation speed of the third sample, and symbol "○" denotes plotted measured values of the SAW propagation speed of the fourth sample.

It can be seen from FIG. 5 that the ratio Vo/Vm decreases by ion implantation and accordingly the electromechanical coupling factor decreases.

The ratio Vo/Vm of the third sample obtained by heating the second sample at 200° C. for 10 minutes in a vacuum of approximately $2 \times 10^{-8}$ Torr is increased so that it is located between the ratio Vo/Vm of the first sample and the ratio Vo/Vm of the second sample.

It can be seen from FIG. 5 that the ratio Vo/Vm of the fourth sample obtained by heating the second sample at 350° C. for 30 minutes in a vacuum of approximately $2 \times 10^{-8}$ Torr is increased so that it is approximately equal to the ratio Vo/Vm of the first sample.

It is to be noted that the inventors found through the experiments as shown in FIG. 5 that almost the same relationship between Vo/Vm and h/λ as that of the sample in which no ions are implanted can be obtained by performing the heat treatment (equal to or higher than 350° C.) on the samples in which ions are implanted and that the present invention was made based on the new facts found by the inventors.

Figure 6:
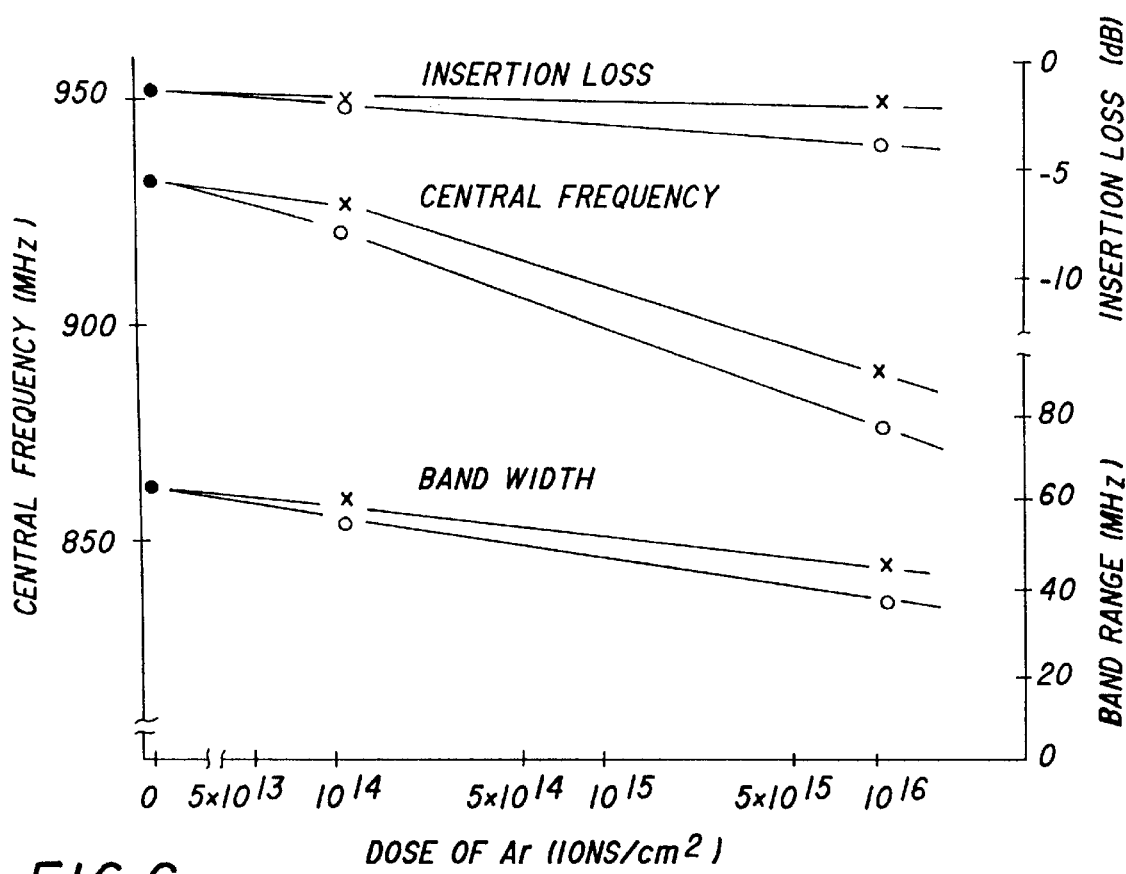
FIG. 6 is a graph of the central frequency characteristic, insertion loss characteristic and pass-band range characteristic of a SAW filter as a function of a dose of Ar ions.

FIG. 6 is a graph of filter characteristics of a SAW filter. In each of the graphs of FIG. 6, the vertical axes denote the central frequency (MHz), insertion loss (dB) and the band range (MHz) of the SAW filter, and the horizontal axis denotes the dose of Ar ions (ions/cm$^2$) implanted in the substrate of the SAW device.

In the measurement, five different types of samples of the SAW filter were prepared in which the substrate thereof was a single crystal of LiTaO$_3$. The first sample has the LiTaO$_3$ substrate in which no ions were implanted (a dose is zero: measured values are plotted by symbol "·". The second sample has the LiTaO$_3$ substrate in which Ar ions were implanted at 180 keV and a dose of $1 \times 10^{14}$ ions/cm$^2$. The third sample has the LiTaO$_3$ substrate in which Ar ions were implanted at 180 keV and a dose of $1 \times 10^{16}$ ions/cm$^2$. The measured values of the second and third samples are lotted by symbol "○" in FIG. 6. The fourth sample was formed by heating the second sample at 300° C. for 30 minutes. The fifth sample was formed by heating the third sample at 300° C. for 30 minutes. The measured values of the fourth and fifth samples are plotted by symbol "×" in FIG. 6.

The central frequency of the second sample (Ar ions are implanted at a dose of $1 \times 10^{14}$ ions/cm$^2$) becomes 55 MHz (5.9%) lower than the central frequency of the first sample (no Ar ions are implanted) by the ion implantation. The central frequency of the fourth sample is slightly restored by the heat treatment and is 42 MHz (4.5%) lower than the central frequency of the first sample.

The band width of the second sample becomes 26 MHz (41%) narrower than the band width of the first sample by the ion implantation. The band width of the fourth sample is slightly restored by the heat treatment and is 20 MHz (32%) narrower than the band width of the first sample.

The insertion loss of the second sample is degraded by 2.3 dB (2.3%) by the ion implantation. The insertion loss of the fourth sample is slightly restored by the terminal treatment and is 0.6 dB (0.6%) greater than that of the fourth sample.

It can be seen from FIG. 6 that by the heat treatment, the characteristics of the SAW filter in which ions are implanted becomes close to those thereof in which no ions are implanted. It can also be seen from FIG. 6 that as the dose of implanted ions increases, the central frequency of the SAW filter more greatly deviates from that of the SAW filter in which no ions are implanted.

With the above in mind, a SAW filter 21 of a ladder type shown in FIGS. 8A and 8B will be considered. The SAW filter 21 includes four one-terminal-pair (one port) SAW resonators R1, R2, R3 and 4 and inductance elements L1 and L2. The resonators R1 and R2 are connected in series between a pair of terminals 22 and 23 by means of conductors 26, 27 and 28 serving as series arms. A pair of terminals 24 and 25 is connected together by a conductor 29. The resonator R3 and the inductance element L1 connected in series are connected to the conductors 26 and 29, respectively. The resonator R4 and the inductance element L2 connected in series are connected to the conductors 27 and 29, respectively. In other words, the resonator R3 and the inductance element L1 are provided in a parallel arm, and the resonator R4 and the inductance element L2 are provided in another parallel arm.

As shown in FIG. 8B, each of the resonators R1, R2, R3 and R4 is made up of an excitation interdigital electrode 30 having two comb-type electrodes, and a pair of reflectors 31. The resonators R1, R2, R3 and R4 are formed on the ion-implantation layer obtained by implanting ions in the surface portion of the piezoelectric substrate and carrying out the heat treatment for the piezoelectric substrate according to the aforementioned method.

Figure 8C:
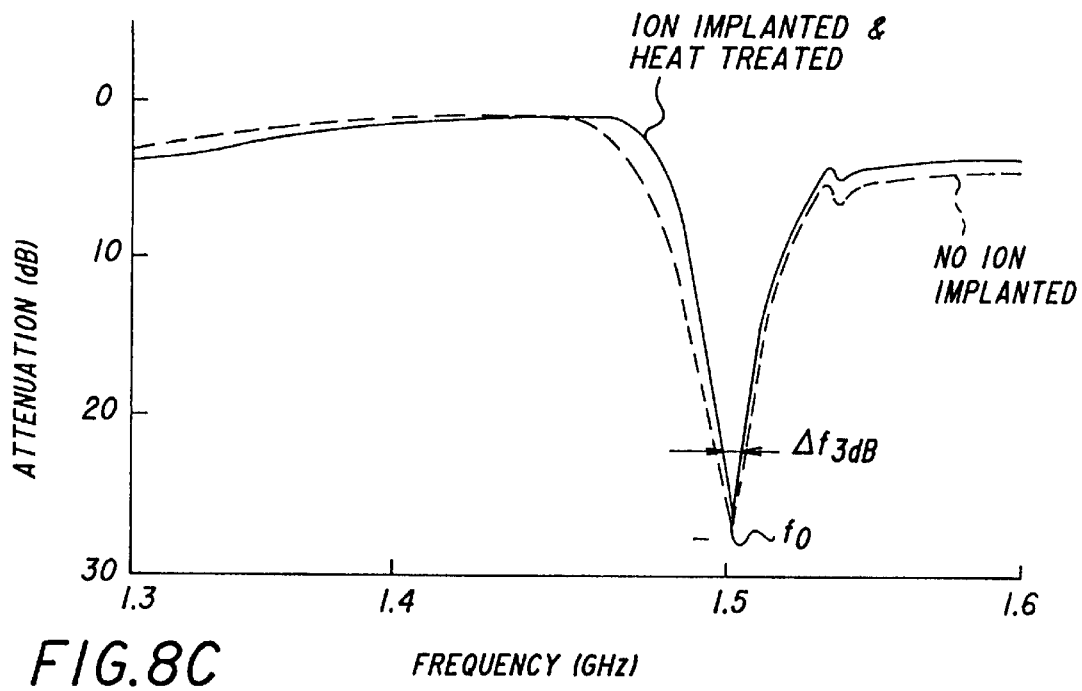
FIG. 8C is a graph of a resonator characteristic of the resonator shown in FIG. 8B.

FIG. 8C is a graph of the resonance characteristic of the resonators in the SAW filter shown in FIG. 8B. In the graph of FIG. 8C, the vertical axis denotes attenuation (dB) and the horizontal axis denotes the frequency (GHz). The solid line indicates the characteristic of the SAW resonators in which the heat treatment of the ion implantation layer has been performed. The broken line indicates the characteristic of the SAW resonators in which no ions are implanted. The Q-value is defined as follows:

$$Q = fo/\Delta f_{3dB}$$

where fo is the frequency of the lowermost attenuation point, and $f_{3dB}$ is the half-value width at the level 3 dB higher than the level of the lowermost point.

Table shown below show the Q-values of the two resonator characteristics.

TABLE

|  | Q value |
|---|---|
| No ion implantation | 440 |
| Ion implantation & heat treatment | 550 |

It can be seen from the above Table that the ion implantation and the subsequent heat treatment make the drop of the resonance characteristic shaper than that of the resonator characteristic of the SAW resonators in which no ions are implanted. By combining the resonators having different Q-values, it becomes possible to obtain the filter characteristics having a good shape factor (which will be described in detail later).

Figure 9:
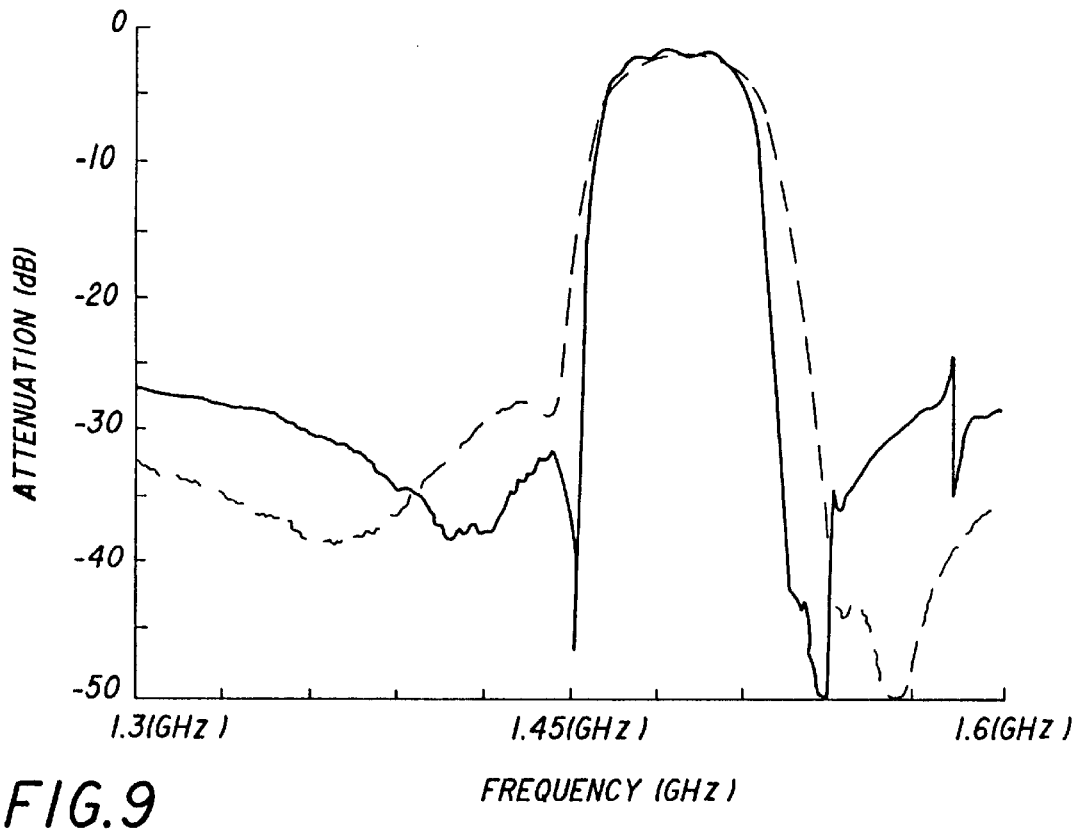
FIG. 9 is a graph of the pass-band characteristic of a ladder-type SAW filter.

FIG. 9 is a graph of the band-pass characteristics of two samples. One of the samples (first sample) is a SAW resonator-type filter having ion implantation layers. The other sample (second sample) is a SAW resonator-type which does not have any ion implantation layer. The solid-line curve shown in FIG. 9 indicates the band-pass characteristic of the first sample, and the broken-line curve shown therein indicates the band-pass characteristic of the second sample. The ion implantation of the first samples was carried out in such a way that double-charge Ar ions ($Ar^{++}$) were implanted in a $LiTaO_3$ (36° Y cut) substrate at 180 keV at a dose of $5 \times 10^{13}$ ions/cm² and the thickness of the ion implantation layer of the first sample was set to 2200 Å ($h_{ion}/\lambda_w = 0.22/2.7 = 0.081$). The heat treatment subsequent to the above ion implantation process was carried out according to the following steps (temperature profile) for the reason which will be described later:

1) Temperature rising speed from the room temperature to a predetermined heat treatment temperature: 2° C. per minute;
2) Time period when the predetermined heat treatment temperature is kept: 1 hour; and
3) Temperature falling speed from the predetermined heat treatment temperature to the room temperature: 1° C. per minute.

It can be seen from FIG. 9 that the filter has a high Q-value and an 20%-improved shape factor without degradation of the insertion loss and the suppression performance.

Figure 10:
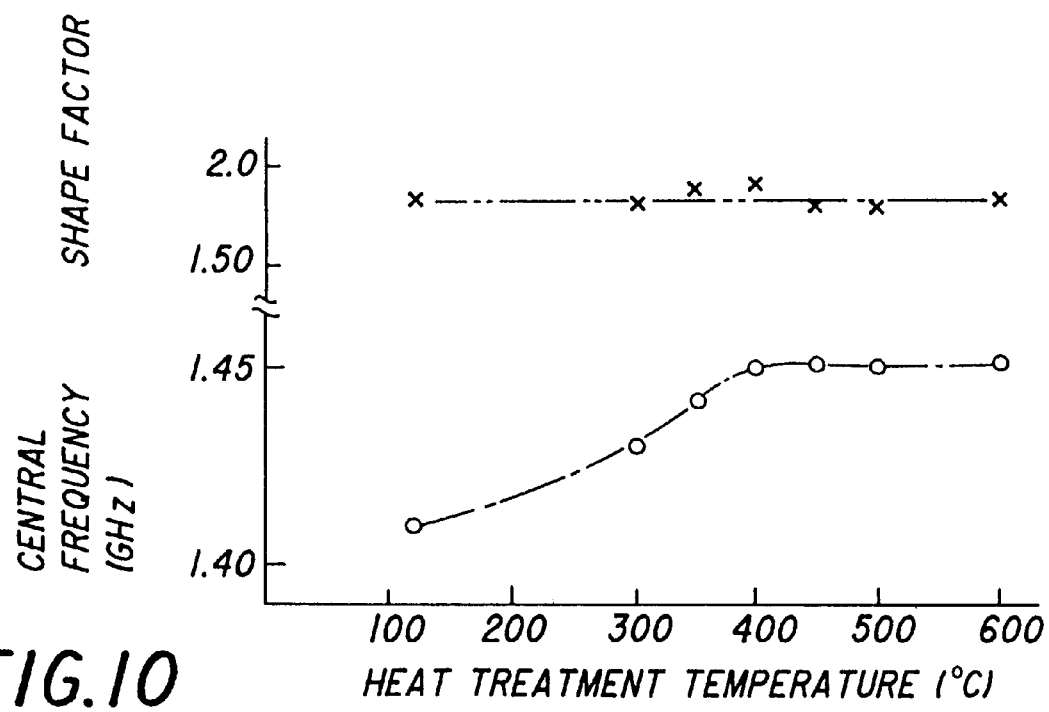
FIG. 10 is a graph of the central frequency and shape factor of a ladder-type SAW filter as a function of the heat treatment temperature.

FIG. 10 is a graph of the conditions of the heat treatment in which Ar ions are implanted in the piezoelectric substrate. The vertical axis of the graph of FIG. 10 denotes the central frequency (GHz) and the shape factor of a SAW filter, and the horizontal axis denotes the heat treatment temperature (° C.).

Figure 11:
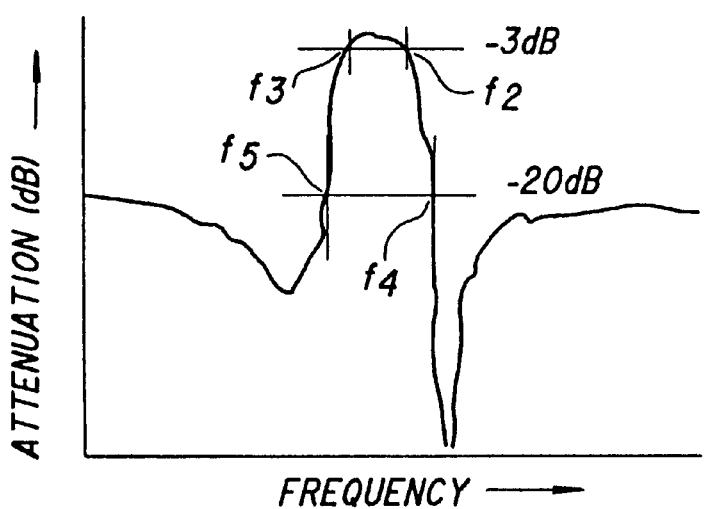
FIG. 11 is a graph for explaining the shape factor of the SAW filter.

The shape factor indicates the sharpness of the rise and fall of the waveform of a signal in the pass-band. More particularly, referring to FIG. 11, the shape factor is defined by the ratio $_\Delta f_2 / _\Delta f_1$ where $_\Delta f_1$ is the band width ($f_2 - f_3$) at an insertion loss of −3 dB and $_\Delta f_2$ is the band width ($f_4 - f_5$) at an insertion loss of −20 dB. The ideal value of the shape factor is 1. The value of the shape factor increases, the sharpness of the rise and fall of the waveform deteriorates. The shape factor of the SAW filter in which no ions are implanted is equal to 2.3, while the shape factor is improved to 1.7 by implanting ions in the above SAW filter as shown in FIG. 9.

The sample of the SAW filter used in the measurement related to the graph of FIG. 10 had the piezoelectric substrate 1 cut out of a 36°-Y-cut single crystal of $LiTaO_3$. Ar ions ($Ar^{++}$) in the double-charge state were implanted in the piezoelectric substrate 1 at an acceleration energy of 180 keV and a dose of $6 \times 10^{13}$ ions/cm². The heat treatment was carried out within the range of 120° C. to 600° C. It can be seen from the graph of FIG. 11 that the shape factor is stable between the heat treatment temperature between 120° C. and 600° C., and the central frequency is stable at heat treatment temperatures equal to or higher than 350° C., preferably 400° C. It is also necessary for the heat treatment temperature to be less than the Curie temperature of the piezoelectric substrate material. The Curie temperature of $LiTaO_3$ is approximately 610° C.

In the heat treatment of the ion implantation layer 11, that is, the heat treatment at temperatures equal to or higher than 350° C., it is preferable to set the heat treatment temperature as low as possible in terms of productivity and operationability. In the embodiment being considered, it is recommendable that the practical heat treatment temperature falls within the range of approximately 400° C. to 600° C. For example, when the piezoelectric substrate 1 is cut out of a 36°-Y-cut single crystal of $LiTaO_3$, it is possible to set the heat treatment temperature within the range between 400° C. and 600° C.

There is a possibility that the piezoelectric substrate 1 may be damaged due to thermal shock in the heat treatment (heating and cooling) of the ion implantation layer 11 formed in the piezoelectric substrate 1, when rapidly heating or cooling the piezoelectric substrate 1. The inventors repeatedly conducted experiments in order to prevent the thermal shock, and found the following heat treatment conditions. The heat treatment in the measurement shown in FIG. 10 was carried out under the following conditions (temperature profile).

1) Temperature rising speed from the room temperature to a predetermined heat treatment temperature: 3° C. per minute or lower;
2) Time period when the predetermined heat treatment temperature is kept: 30 minutes −1 hour; and
3) Temperature falling speed from the predetermined heat treatment temperature to the room temperature: 2° C. per minute or lower.

It is also possible to control the SAW propagation speed and the electromechanical coupling factor by controlling the depth of ion implantation (the thickness of the ion implantation layer) in order to control the state of the crystal lattice in the surface portion of the piezoelectric substrate. In order to inspect the relationship between the depth of ion implantation and the SAW performance, a description will now be given of the method of measuring the depth of ion implantation.

Figure 12:
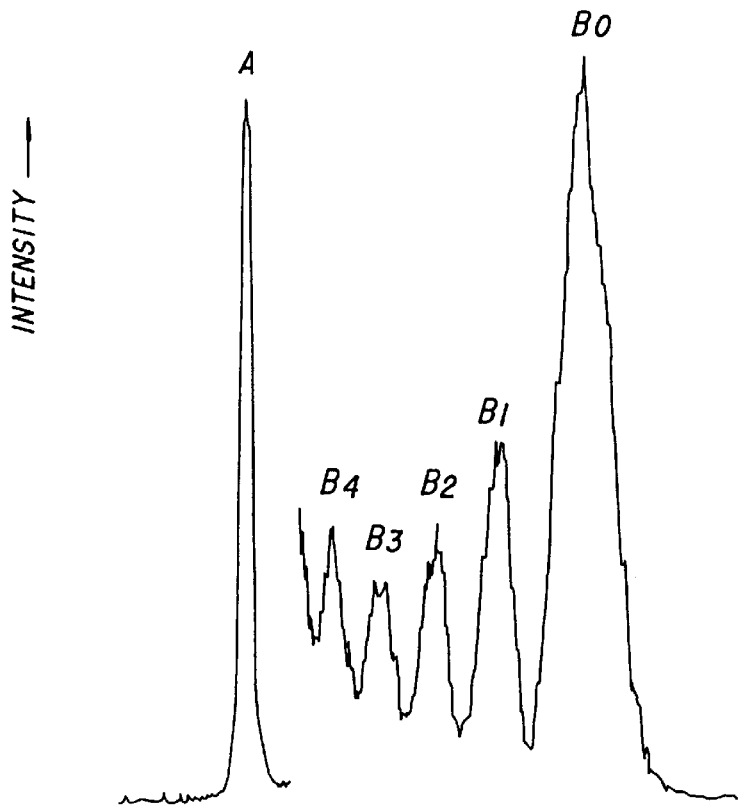
FIG. 12 is a graph of a locking curve used to measure the depth of ion implantation.

The depth of ion implantation can be measured by using a locking curve of double crystal X-ray diffraction for the ion implantation layer. FIG. 12 shows a locking curve of a sample in which double-charge Ar ions ($Ar^{++}$) are implanted in an $LiTaO_3$ substrate at 180 keV and a dose of $5 \times 10^{13}$ ions/cm$^2$, the locking curve being obtained by using CuK$\alpha$1X rays. In FIG. 12, a diffraction spectrum A located at the largest diffraction angle (left end in the drawing) results from the $LiTaO_3$ substrate. Other diffraction spectra result from the ion implantation layer. The diffraction spectrum located at the lowest diffraction angle is the primary maximum (B0), and the first (B1), second (B2), . . . and secondary maximum diffraction spectra are observed in this order. From the characteristic of the Laue function indicating the scattering strength of X rays, the thickness of the ion implantation layer is calculated using the half-value width of the primary maximum (B0) shown in FIG. 12. The calculated thickness of the ion implantation layer is approximately 2200 Å. In the above-mentioned manner, the depth of ion implantation can be confirmed.

Figure 13:
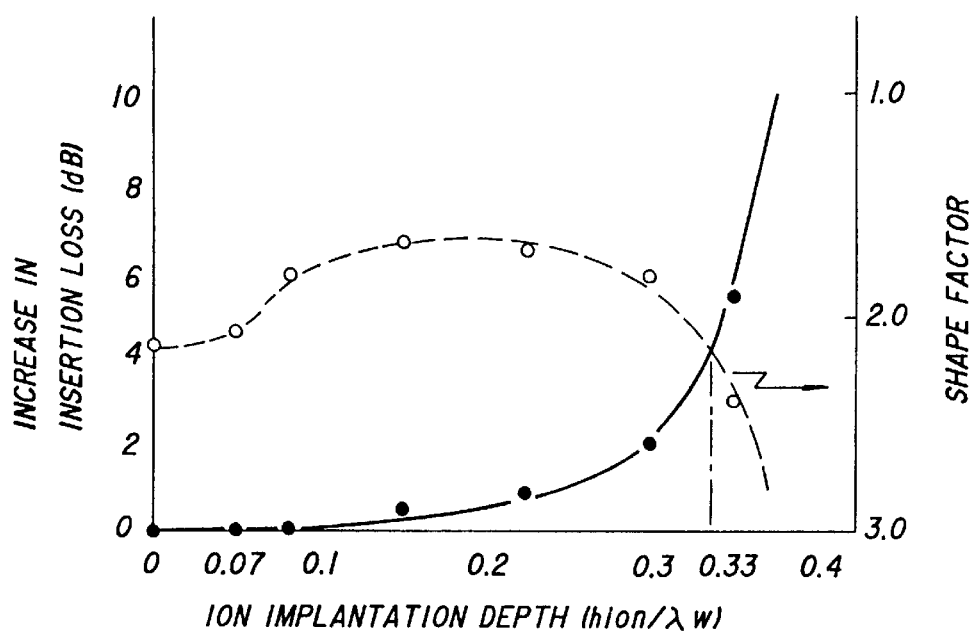
FIG. 13 is a graph of the insertion loss characteristic and filter shape factor characteristic as a function of the depth of ion implantation.

FIG. 13 is a graph of increase in the insertion loss (dB) and the filter shape factor of samples as a function of the thickness of the ion implantation layer. The samples was formed by implanting double-charged Ar ions ($Ar^{++}$) into a $LiTaO_3$ (36° Y cut) at 180 keV and a dose of $5 \times 10^{13}$ ions/cm$^2$, and had different thicknesses of the ion implantation layers (which were confirmed by the aforementioned measurement method). In FIG. 13, the vertical axes denote an increase in the insertion loss (dB) and the filter shape factor, and the horizontal axis denotes the normalized depth ($h_{ion}/\lambda_w$) of the ion implantation obtained by normalizing the depth hion by one wavelength $\lambda_w$ of the surface acoustic wave. Normally, the surface acoustic wave propagates through a surface portion of the piezoelectric substrate within a depth equal to one wavelength of the surface acoustic wave. If ions are implanted in a depth greater than one wavelength, the surface crystal portion is completely destroyed and the propagation of the surface acoustic wave is affected. It can be seen from the graph of FIG. 13 that a good filter characteristic can be obtained when the filter shape factor (the ratio the band width at −1.5 dB lower than the level at the least insertion loss to the band width at −21.5 dB lower than the level at the least insertion loss) is equal to or greater than 45% under the condition the increase in the insertion loss is equal to or less than 2 dB.

In order to obtain a filter shape factor of 45% or greater, the graph of FIG. 13 shows that the thickness ($h_{ion}$) of the ion implantation layer is needed to satisfy the condition $0.07 < h_{ion}/\lambda_w < 0.33$. Further, in order to obtain an insertion loss equal to or less than 2 dB when taking into consideration the insertion loss, the thickness ($h_{ion}$) of the ion implantation layer is needed to satisfy the condition $0.07 < h_{ion}/\lambda_w < 0.30$. When using Ar ions, ion implantation can be easily carried out by means of an ordinary ion implantation apparatus rather than a specific one when the thickness ($h_{ion}$) of the ion implantation layer is needed to satisfy the condition $0.07 < h_{ion}/\lambda_w < 0.15$.

Figure 14A:
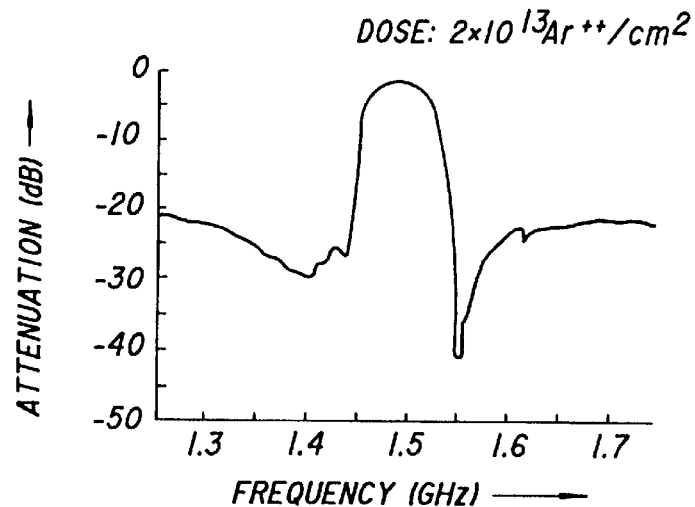
FIGS. 14A, 14B, 14C, 14D, 14E and 14F are graphs the pass-band characteristics of samples in which different doses of ions are implanted.
Figure 14B:
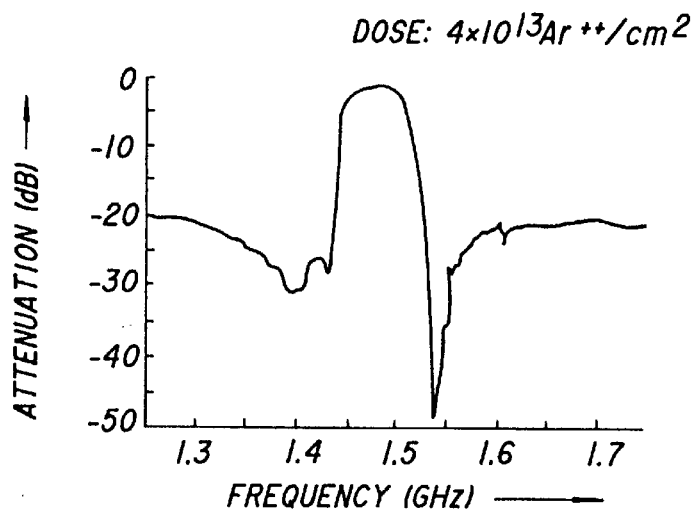
Figure 14C:
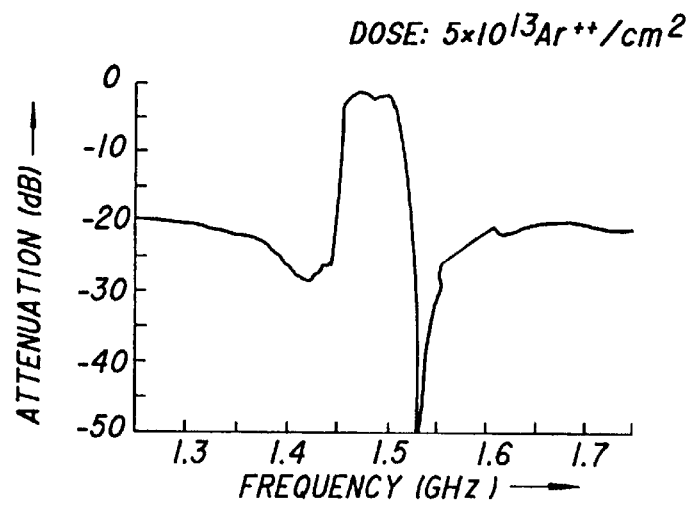
Figure 14D:
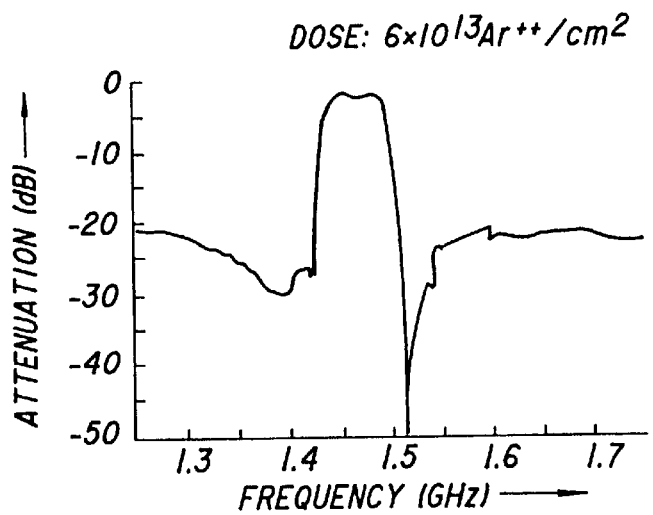
Figure 14E:
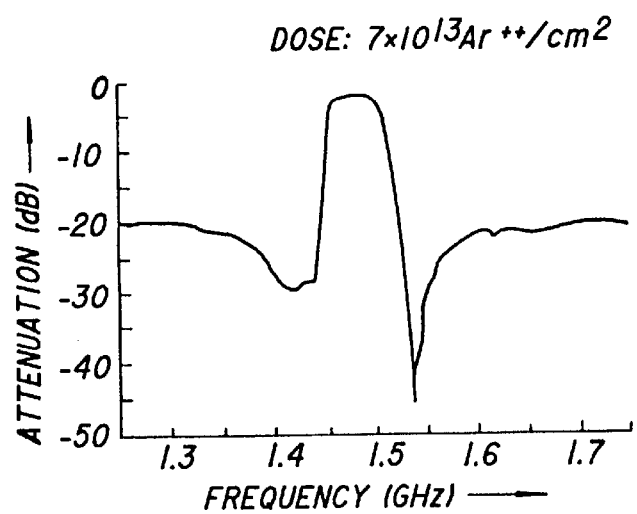

A description will now be given of the relationship between the dose of ions and the filter characteristics. FIGS. 14A through 14F are graphs showing the pass-band characteristics of the SAW filter shown FIGS. 8A and 8B as a function of the dose of Ar ions. In FIGS. 14A through 14F, the acceleration energy of Ar ions ($Ar^{++}$) is 180 keV, and the doses of Ar ions are as follows:

FIG. 14A: $2 \times 10^{13}$ ions/cm$^2$;

FIG. 14B: $4 \times 10^{13}$ ions/cm$^2$;

FIG. 14C: $5 \times 10^{13}$ ions/cm$^2$;

FIG. 14D: $6 \times 10^{13}$ ions/cm$^2$;

FIG. 14E: $7 \times 10^{13}$ ions/cm$^2$; and

Figure 14F:
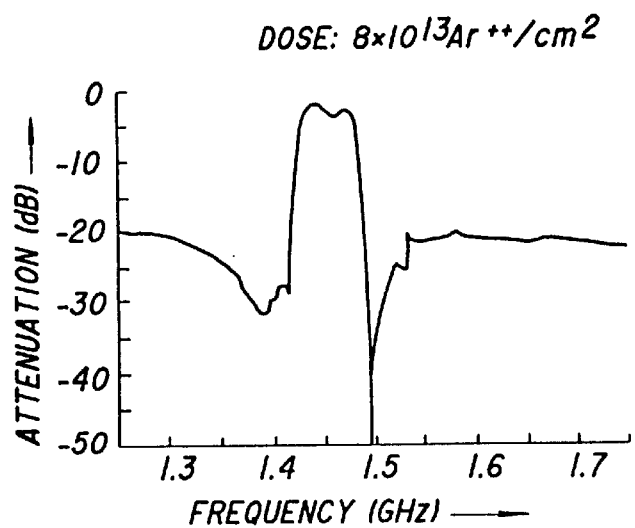

FIG. 14F: $8 \times 10^{13}$ ions/cm$^2$.

The values of the shape factor ($\Delta f_2/\Delta f_1$) of the samples respectively related to FIGS. 14A through 14F are varied as the function of the dose of Ar ions as follows:

FIG. 14A: $_\Delta f_2/_\Delta f_1$=approximately 1.95

FIG. 14B: $_\Delta f_2/_\Delta f_1$=approximately 1.92

FIG. 14C: $_\Delta f_2/_\Delta f_1$=approximately 1.67

FIG. 14D: $_\Delta f_2/_\Delta f_1$=approximately 1.69

FIG. 14E: $_\Delta f_2/_\Delta f_1$=approximately 1.74

FIG. 14F: $_\Delta f_2/_\Delta f_1$=approximately 1.67

It can be seen from the above that the in-pass-band characteristics shown in FIGS. 14C, 14D and 14E are approximately flat, whereas the in-pass-band characteristics shown in FIGS. 14A, 14B and 14F are not flat and does not have good linearity.

As can be seen from the above, the dose of Ar ions can be equal to or greater than $4 \times 10^{13}$ ions/cm$^2$ taking into consideration only the shape factor. However a dose of $8 \times 10^{13}$ ions/cm$^2$ should be excluded taking into consideration the pass-band characteristic. Hence, it is concluded, taking into account the practical insertion loss, that the dose of Ar ions is between $4 \times 10^{13}$ ions/cm$^2$ and $7 \times 10^{13}$ ions/cm$^2$, preferably between $5 \times 10^{13}$ ions/cm$^2$ and $7 \times 10^{13}$ ions/cm$^2$. The pass-band characteristic obtained at the dose of Ar ions within the above range is not varied with the range of the ion acceleration energy between 150 and 250 keV. Hence, it is recommendable that the dose of Ar ions is between 150 and 250 keV.

In the above-mentioned ion implantation, there is a possibility that charges may be stored the piezoelectric substrate 1 or the piezoelectric thin film provided on the predetermined base, which may be then discharged due to pyroelectricity caused by the piezoelectricity of the piezoelectric member and that the piezoelectric substrate or thin film may be destroyed.

Figure 15A:
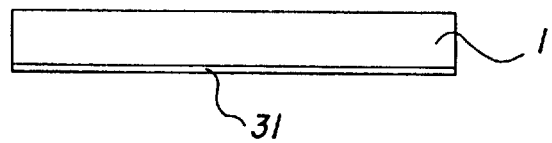
FIGS. 15A and 15B are cross-sectional views of means for preventing pyroelectricity caused when implanting ions.
Figure 15B:
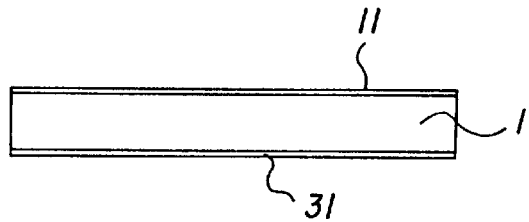
Figure 16A:
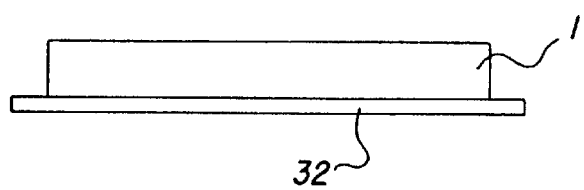
FIGS. 16A and 16B are cross-sectional views of another means for preventing pyroelectricity caused when implanting ions.
Figure 16B:
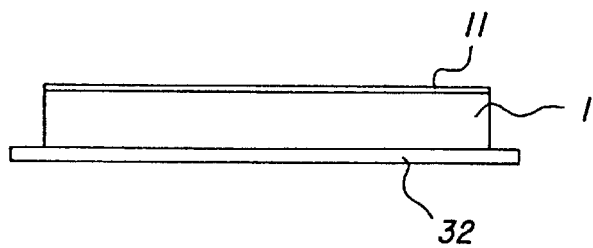

With the above in mind, means for eliminating the above possibility as shown in FIGS. 15A, 15B, 16A and 16B can be employed. In FIG. 15A, a metallic film 31 is coated on the back surface of the piezoelectric substrate 1. Then, as shown in FIG. 15B, the ion implantation layer 11 is formed in the front surface portion of the piezoelectric substrate 1 having the back surface on which the metallic film 31 is coated. Alternatively, as shown in FIG. 11A, a metallic plate 32 is provided on the back surface of the piezoelectric substrate 1. Then, as shown in FIG. 11B, the ion implantation layer 11 is formed in the front surface portion of the piezoelectric substrate 1 having the back surface on which the metallic plate 32 is provided.

A further description will now be given of other applications of SAW devices to SAW resonator type filters.

The period (electrode pitch) λ of the comb-type electrode is defined as follows:

$$\lambda = V/fo$$

where V is the surface acoustic velocity of the SAW and fo denotes the resonance frequency. The surface acoustic velocity V depends on the weight of the electrode, thus the thickness thereof. More particularly, the weight of the electrode becomes greater, the surface acoustic velocity V becomes slower. This is called a mass load effect.

Normally, the SAW resonator-type filter includes SAW resonators of different resonance frequencies which are connected in series and parallel, namely, in a ladder formation. It is possible to obtain desired filter characteristics of the filter by adjusting the resonance frequency interval $_\Delta f$, which is the difference between the resonance frequency ($f_s$) of the series-connection (series-arm) resonator and that ($f_p$) of the parallel-connection (parallel-arm) resonator ($_\Delta f=f_s-f_p$). It will be noted that the resonance frequency of the series-connection resonator is approximately equal to the anti-resonance frequency of the parallel-connection resonator. However, there is a limit regarding adjustment of the resonance frequency interval $_\Delta f$. If the resonance frequency interval exceeds a limited value, the filter characteristics will deteriorate greatly.

The resonance frequency interval $_\Delta f$, which determines the filter characteristics, depends on the difference $_\Delta \lambda$ between the period of the comb-type resonator connected in series and the period of the comb-type resonator connected in parallel. The period difference $_\Delta \lambda$ is limited by the electromechanical coupling factor $k^2$. If the period difference $_\Delta \lambda$ is too small or too large, the SAW resonator-type filter will provide a great insertion loss.

As has been described previously, the electromechanical coupling factor $k^2$ can be controlled by ion implantation and adjustment of the heat treatment condition. This ion implantation functions to relax the above limitation regarding the period difference $_\Delta \lambda$ and to increase the degree of freedom in design of the pass-band of the filter. The heat treatment is not limited to a condition such that the heat treatment temperature is equal to or higher than 350° C. as described previously, but utilizes the fact that the SAW propagation speed is varied by the heat treatment.

Normally, the lines (electrode finger portions) and spaces of the comb-type electrode between two adjacent lines are arranged at a ratio of approximately 1:1, although there are errors due to the precision of the exposure process and the precision of a mask used in the exposure.

For example, a wide-band filter in the 1.5 GHz range is achieved by the following parameters:

Substrate: 36°-Y-cut X propagation LiTaO$_3$
(surface acoustic velocity:approximately 4000 m/s; $k^2=5\%$)
Period of comb-type electrode in series-connection resonator$_s$: 2.60 μm
Period of comb-type electrode in parallel-connection resonator$_p$: 2.70 μm The period difference $_\Delta \lambda$ ($=\lambda_p-\lambda_s$) is 0.1 μm, and a filter characteristic is obtained in which the resonance and anti-resonance frequencies are 60 MHz and the 3 dB band range is approximately 40 MHz.

A low-insertion-loss narrow band filter can be obtained by utilizing a piezoelectric substrate having a small electromechanical coupling factor $k^2$, for example, an ST cut substrate of quartz (the surface acoustic velocity: approximately 3000 m/s; $k^2$:0.16

It has been confirmed from our experimentation that the interval between the resonance frequency and the anti-resonance frequency of the above quarts ST-cut substrate is between 2 MHz and 6 MHz, and is 1/10 to 1/30 as large as that of the 36°-Y-cut X-propagation substrate of LiTaO$_3$.

From the above description, it is possible to achieve a narrow-band filter having the pass-band width between 3 MHz and 4 MHz by the combination of resonators respectively having an electrode pitch $\lambda_s$ of 1.995 μm and $\lambda_p$ of 2.000 μm ($_\Delta \lambda=0.005$ μm).

By the way, a reduced projection exposure method is used to form fine patterns. For example, in order to form the above narrow-band filter by means of a reticle of a magnification of five, the width of each line of the electrode on the reticle used to realize the series-connection and parallel-connection resonators formed on the quartz substrate is respectively 2.49375 μm and 2.500 μm.

Nowadays, the reticle pattern is formed by electron beam exposure. The minimum resolution level currently available in an electron beam exposure apparatus is approximately 0.1 μm. Hence, it is impossible to correctly the electrode line width 2.49375 μm. Hence, there is an error (rounding error) in the electrode line width, and the error decreases the Q value of the filter. This means that it is very difficult to realize narrow-band filters in the high frequency range.

A second embodiment of the present invention which will be described below utilizes the concept of the aforementioned first embodiment thereof, and is intended to achieve high-Q SAW resonator-type filters which have a high Q value and can be produced by the existing electron exposure process. As will be described later, the interval between the series-connection resonator and the parallel-connection resonator of the filter can be finely adjusted.

Figure 17:
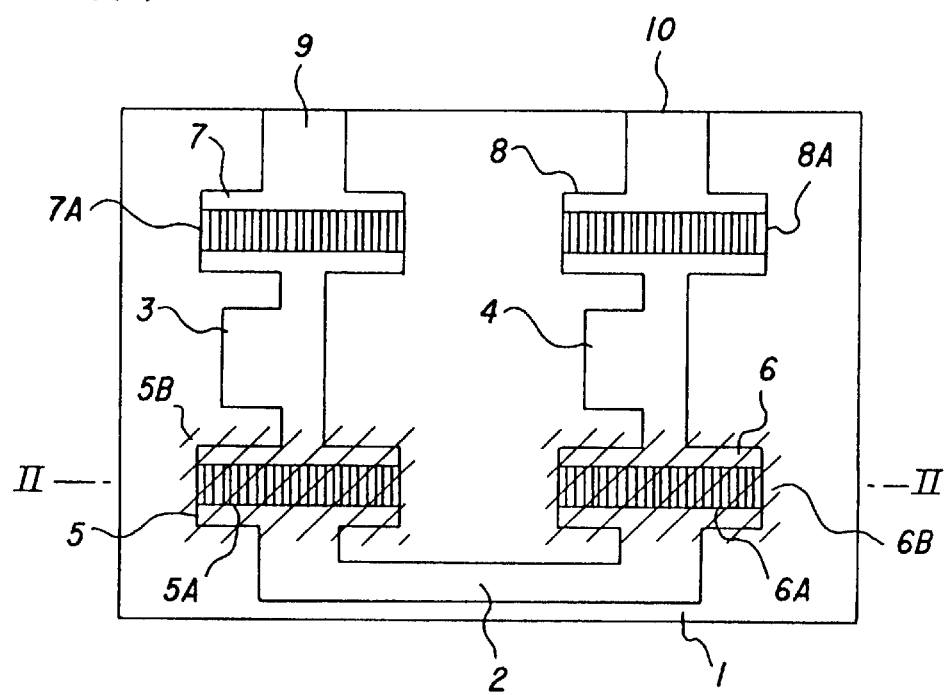
FIG. 17 is a plan view of a SAW filter according to a second embodiment of the present invention.
Figure 18A:
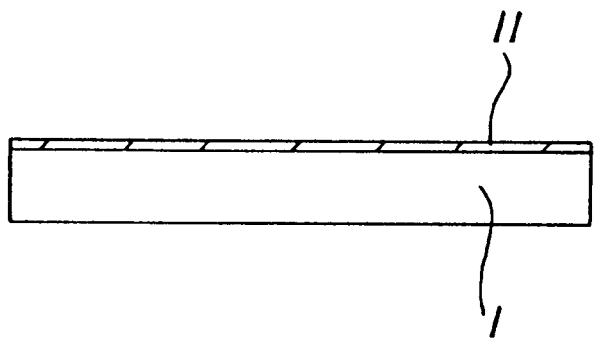
FIGS. 18A, 18B, 18C and 18D are diagrams of a method of producing the SAW filter shown in FIG. 17.
Figure 18B:
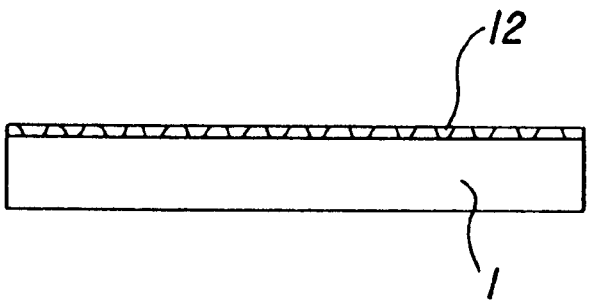
Figure 18C:
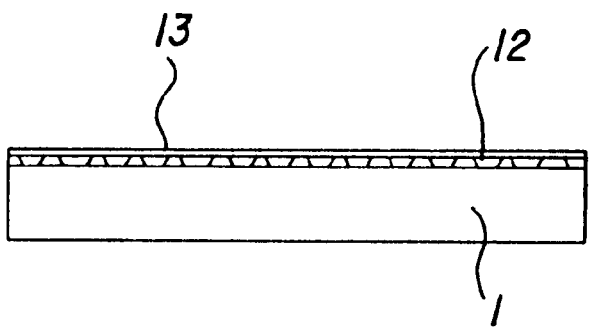
Figure 18D:
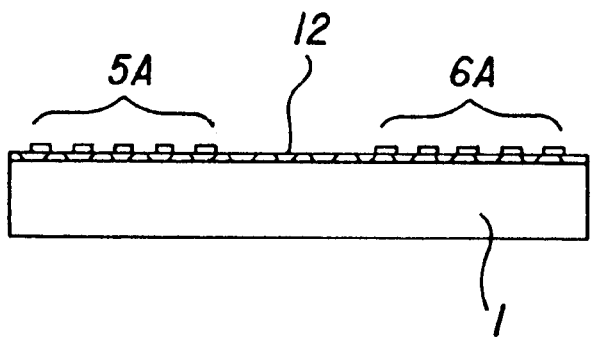

FIG. 17 is a plan view of a SAW resonator-type filter according to the second embodiment of the present invention. In FIG. 17, parts that are the same as those shown in FIGS. 3A through 3D are given the same reference numbers.

The SAW resonator-type filter shown in FIG. 17 is made up of the quartz substrate 1, a conductive wiring line 2, an input terminal 3, an output terminal, a series-connection resonator 5 having an interdigital electrode 5A and an ion implantation layer 5B (hatched area), a series-connection resonator 6 having an interdigital electrode 6A and an ion implantation layer 6B (hatched area), parallel-connection resonators 7 and 8 respectively having interdigital electrodes 7A and 8B, and ground terminals 9 and 10.

The SAW resonator-type filter shown in FIG. 17 is characterized in that the ion (for example, Ar ion) implantation layers 5B and 6B including the electrodes 5A and 6A and their vicinity areas are formed in the series-connection resonators 5 and 6 only in order to reduce the surface acoustic velocity propagating through the ion implantation layers 5B and 6B, so that the resonance frequency interval $_\Delta f$ can be adjusted.

According to our experiment, a variation in the surface acoustic velocity V equal to 99.2% is obtained under the following conditions:

Implanted ion: Ar ion
Acceleration energy: 180 keV
Dose: 1×10$^{14}$ ions/cm$^{-2}$.

Hence, by implanting ions in portions including the series-connection resonators 5 and 6 and determining the following parameters, Period of comb-type electrodes in series-connection resonators 5 and 6 $\lambda_s$: 1.98 μm
Period of comb-type electrodes in parallel-connection resonators 7 and 8 $\lambda_p$: 2.00 μm it is possible to obtain filter characteristics equivalent to those of a SAW resonator-type filter having no ion implantation layers and the following parameters:
Period of comb-type electrodes in series-connection resonators 5 and 6 $\lambda_s$: 1.996 μm
Period of comb-type electrodes in parallel-connection resonators 7 and 8 $\lambda_p$: 2.000 μm It will be noted that the period 1.98 μm of the comb-type electrodes in the series-connection resonators 5 and 6 is lower than the limit regarding the formation of fine patterns in the lithography technique because patterns having a size five times the above period are formed the reticle on which patterns are formed by the electron beam exposure technique.

It is possible to adjust the frequency of the overall filter by implanting ions in the series-connection resonators and/or parallel-connection resonators after the ion implantation layers 5B and 6B are formed. By the above frequency adjustment, it is possible to correct a frequency deviation caused by a factor of the production process.

FIGS. 18A through 18D are cross-sectional views of the method of producing the SAW resonator-type filter shown in FIG. 17. The cross-sections shown in FIGS. 15A through 15B are taken along line II—II shown in FIG. 17. The steps shown in FIGS. 18A through 18D are almost the same as those shown in FIGS. 3A through 3D, respectively. The heat treatment shown in FIG. 3C is not necessary to produce the SAW resonator-type filter according to the second embodiment of the present invention. However, the heat treatment provides various advantages, as has been described previously. Hence, it is preferable to form the heat treatment layer 12 by heating the ion implantation layer 11.

The previous descriptions given with reference to the previously described figures hold true for the SAW resonator-type filter shown in FIG. 17. In short, when Ar ions are used, it is preferable to employ the following conditions. That is, the dose of Ar ions can be equal to or greater than $4 \times 10^{13}$ ions/cm² taking into consideration only the shape factor. However a dose of $8 \times 10^{13}$ ions/cm² should be excluded taking into consideration the pass-band characteristic. Hence, it is concluded, taking into account the practical insertion loss, that the dose of Ar ions is between $4 \times 10^{13}$ ions/cm² and $7 \times 10^{13}$ ions/cm², preferably between $5 \times 10^{13}$ ions/cm² and $7 \times 10^{13}$ ions/cm². The pass-band characteristic obtained at the dose of Ar ions within the above range is not varied with the range of the ion acceleration energy between 150 and 250 keV. Hence, it is recommendable that the ion acceleration energy of Ar ions is between 150 and 250 keV.

It is also preferable to control the ion implantation depth. As has been described previously, it is preferable to control the thickness ($h_{ion}$) of the ion implantation layer satisfies the condition $0.07 < h_{ion}/\lambda_w < 0.33$.

Figure 19:
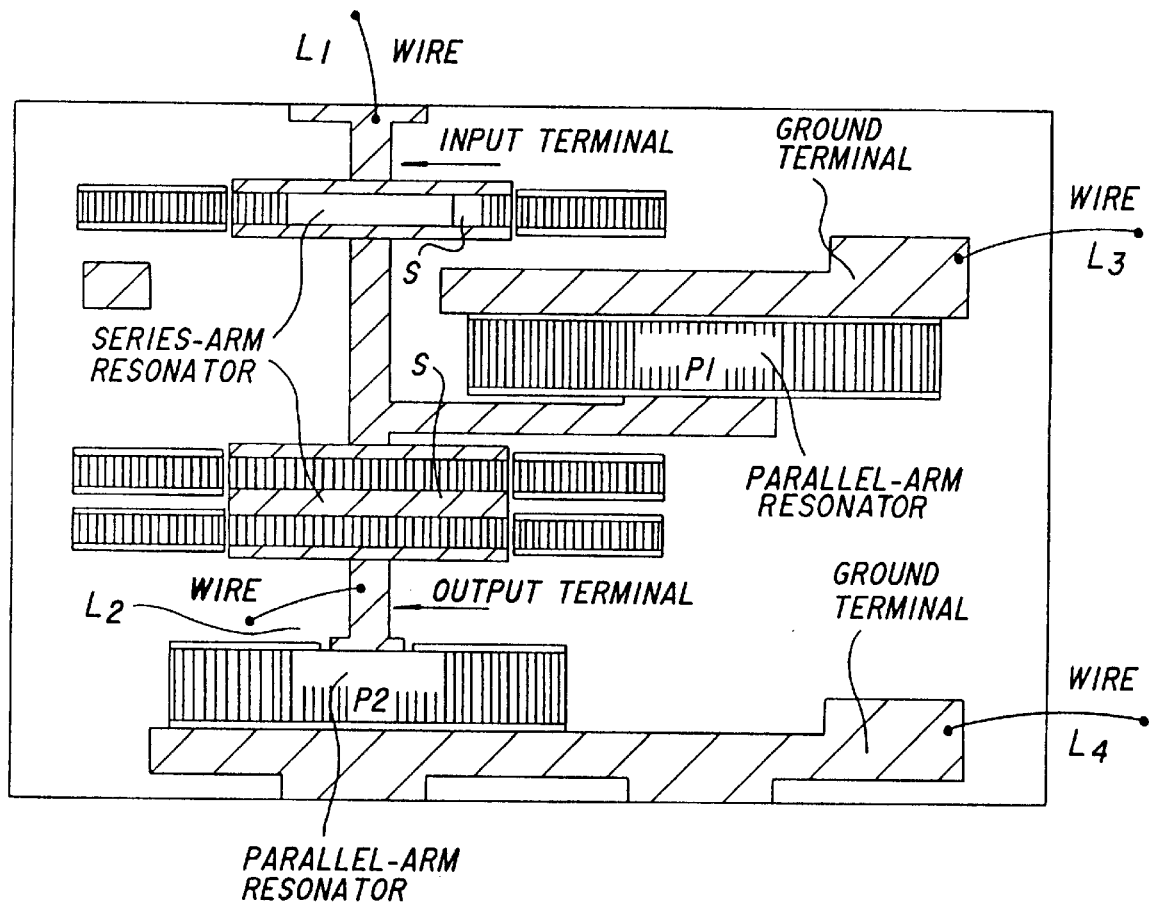
FIG. 19 is a plan view of a practical example of the SAW filter shown in FIG. 17.
Figure 20:
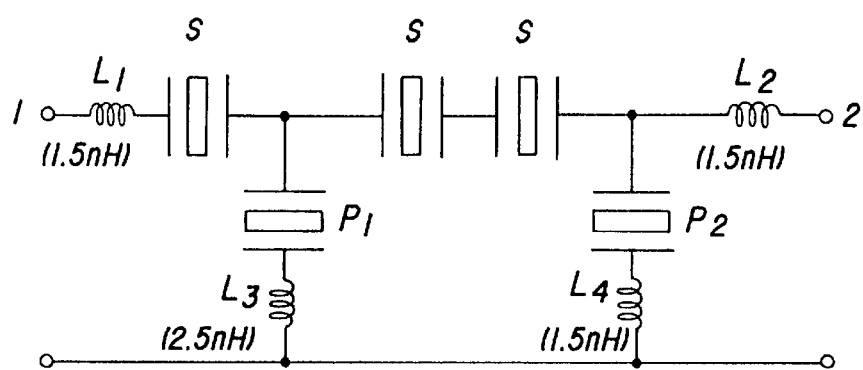
FIG. 20 is an equivalent circuit diagram of the SAW filter shown in FIG. 19.

In FIG. 19 is a plan view of a practical example of the second embodiment of the present invention, and FIG. 20 is an equivalent circuit diagram of the filter shown in FIG. 19. As shown in FIGS. 19 and 20, the filter is made up of three series-connection (series-arm) resonators S and two parallel-connection (parallel-arm) resonators P1 and P2. L1 through L4 respectively denote wires shown in FIG. 17, and inductances shown in FIG. 18. The ion implantation process was carried out for the series-connection resonators S only. The period of the two comb-type electrodes of each of the series-connection resonators S is 2.64 µm, the aperture length is 60 µm, and the number of finger pairs are 115. The period of the two comb-type electrodes of the parallel-connection resonator P1 is 2.71 µm, the aperture length is 100 µm, and the number of finger pairs are 80. The period of the two comb-type electrodes of the parallel-connection resonator P2 is 2.71 µm, the aperture length is 100 µm, and the number of finger pairs are 40.

A description will now be given, with reference to FIG. 21, of a SAW resonator-type filter according to a third embodiment of the present invention. The SAW filter shown in FIG. 21 includes a quarts substrate, a wiring line 42, an input terminal 43, a series-connection resonator 44 including an interdigital electrode 45 made up of two comb-type electrodes, and a parallel-connection resonator 46 including an interdigital electrode 47 made up of two comb-type electrodes.

Figure 22A:
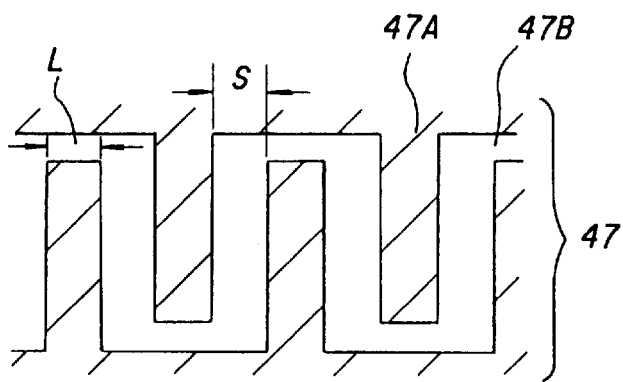
FIGS. 22A and 22B are plan views of comb-type electrodes of a resonator structure used in the SAW filter shown in FIG. 21.
Figure 22B:
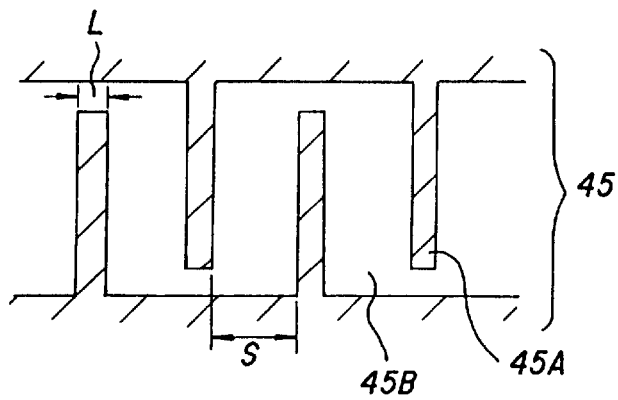

FIG. 22A shows a part of the interdigital electrode 47 of the parallel-connection resonator 46, and FIG. 22B shows a part of the interdigital electrode 45 of the series-connection resonator 44. The interdigital electrode 47 has lines 47A and spaces 47B. Similarly, the interdigital electrode 45 has lines 45A and spaces 45B. In FIG. 22A, the symbol "L" denotes the width of the lines 47A and the symbol "S" denotes the width of the spaces 47B. In FIG. 22B, the symbol "L" denotes the width of the lines 46A and the symbol "S" denotes the width of the spaces 46B.

It can be seen from FIGS. 22A and 22B that the ratio L:S of the parallel-connection resonator 46 is set to 1:1 (for example, 0.4 µm:0.4 µm), and the width of each line 45A is less than that of each line 47A.

Our experiment shows that the surface acoustic velocity becomes faster by 3% when the ratio L:S of the series-connection resonator 44 is set to 0.91:1.09 (for example, 0.36 µm:0.44 µm).

The crystal substrate having the above series-connection resonator 44 and the parallel-connection resonator 46 respectively having the following ratios has a filter characteristic equivalent to a filter such that $\lambda_p = 2.000$ µm and $\lambda_s = 1.994$ µm:

L:S in parallel-connection resonator=0.40 µm:0.40 µm
L:S in series-connection resonator=0.36 µm:0.44 µm.

Figure 21:
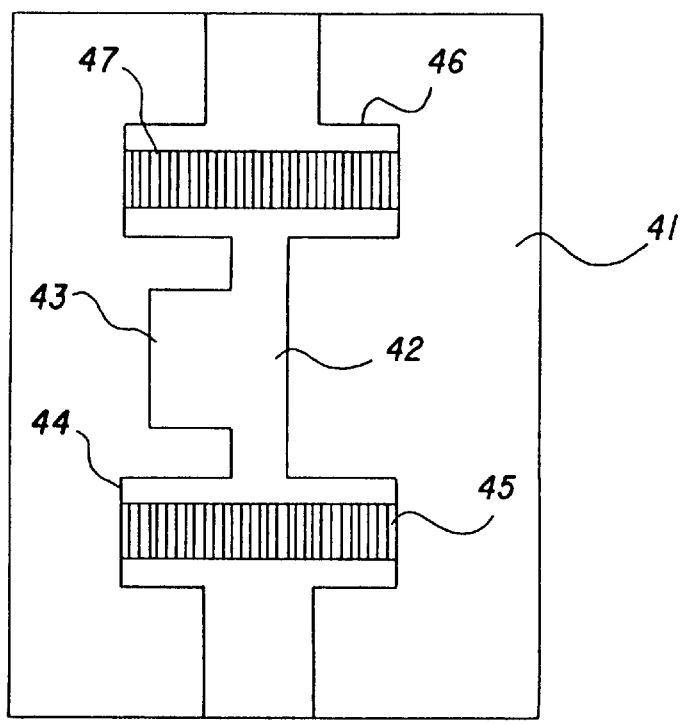
FIG. 21 is a plan view of a SAW filter according to a third embodiment of the present invention.
Figure 23:
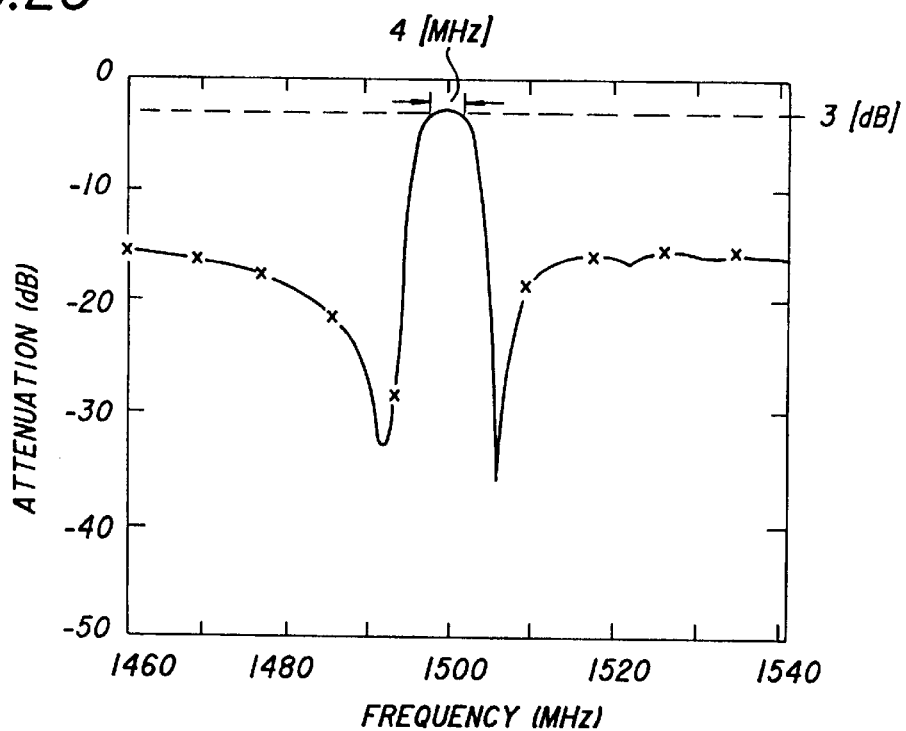
FIG. 23 is a graph of the pass-band characteristic of the SAW filter shown in FIG. 21.

FIG. 23 is a graph of a filter characteristic of the filter shown in FIG. 21 having the above-mentioned parameter values. In FIG. 23, the vertical axis denotes the insertion loss (dB), and the horizontal axis denotes the frequency (MHz). It can be seen from the graph of FIG. 23 that the interval $_\Delta$f between the resonance frequency of the series-connection resonator and the resonance frequency of the parallel-connection resonator can be controlled by varying the surface acoustic velocity and a sufficiently narrow band characteristic can be realized.

Figure 24:
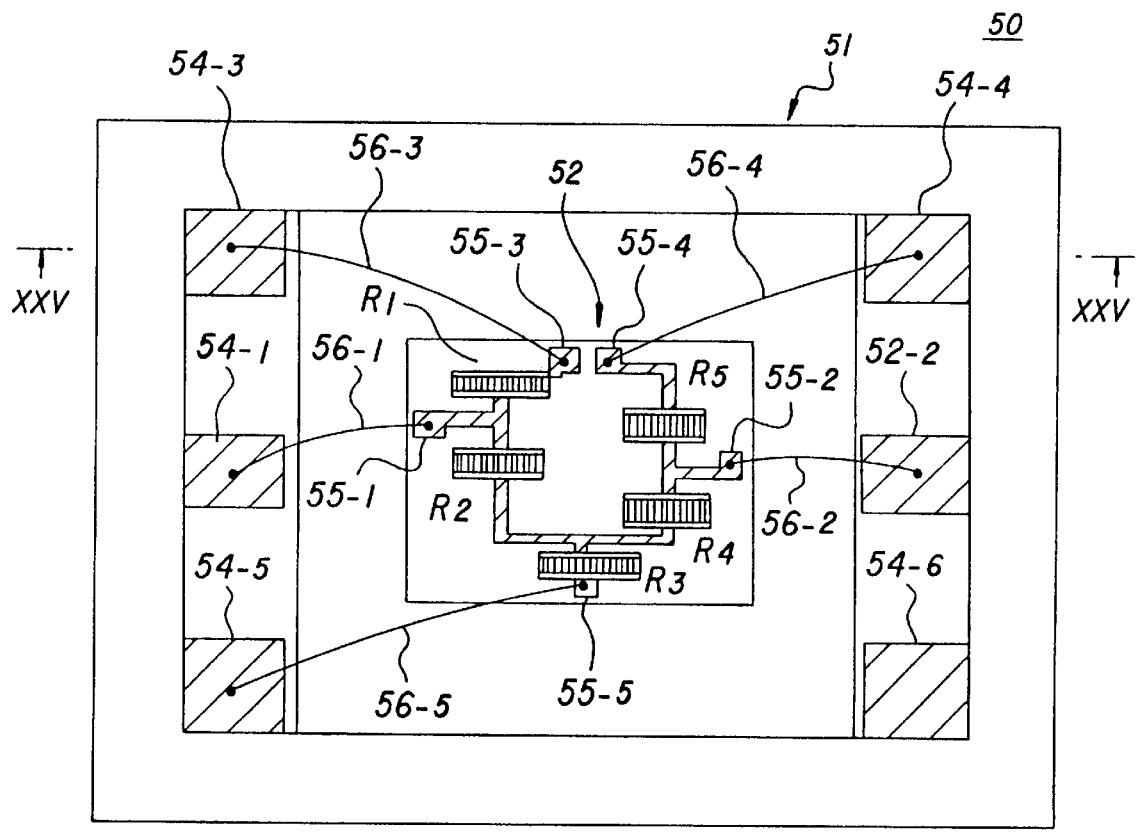
FIG. 24 is a plan view of a practical example of the SAW filter according to the present invention.
Figure 25:
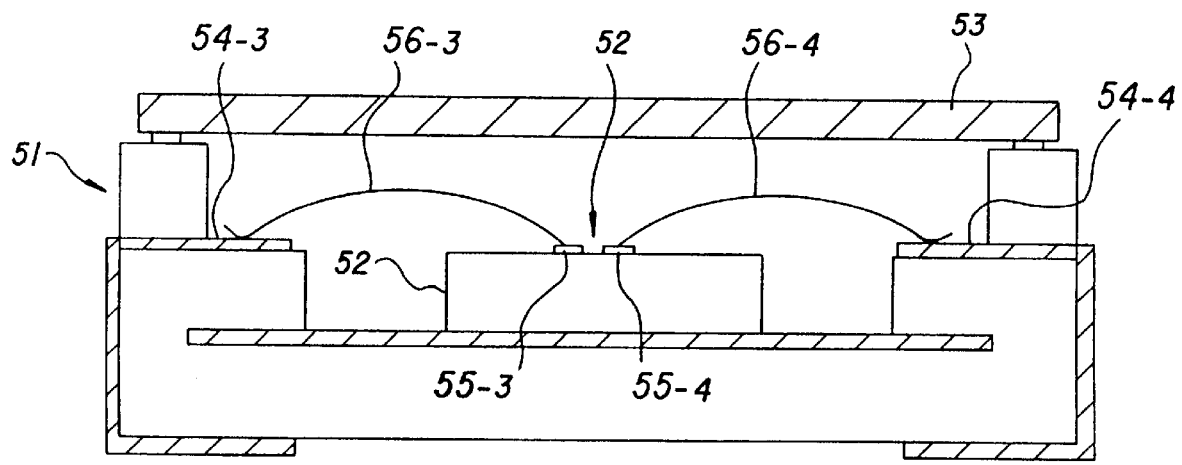
FIG. 25 is a cross-sectional view taken along line XXV—XXV shown in FIG. 24.
Figure 26:
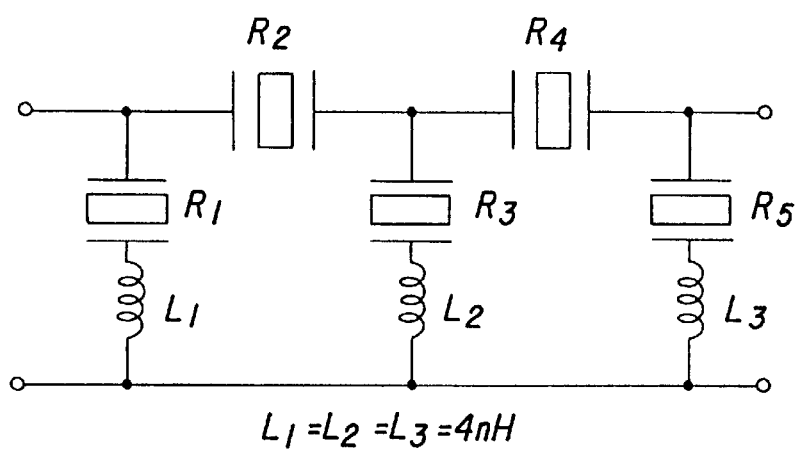
FIG. 26 is an equivalent circuit diagram of the SAW filter shown in FIG. 24.

FIGS. 24 and 25 show a practical example of the SAW filter according to the present invention. FIG. 26 is an equivalent circuit diagram of the SAW filter shown in FIGS. 24 and 25. The SAW filter shown in FIGS. 24 and 25 includes a ceramic package 51, a filter chip 52 and a lid 53 functioning as the ground. The ceramic package 51 is made of alumina ceramic, and dimensions of 3.8 mm×3.8 mm×1.5 mm (height). Electrode terminals $54_{-1}$ through $54_{-6}$ made of Au are formed on the ceramic package 51. The filter chip 52 is made of LiTaO₃, and dimensions of 2 mm×1.5 mm×0.5 mm (thickness). The thickness of ion implantation layers formed in the surface portion of the filter chip 52 is 2200 Å.

On the surface of the filter chip 52, there are provided resonators R1 through R5 having a comb-type electrode structure made of Al-2%Cu, having 100 finger pairs, an aperture length of 80 µm, a wavelength $_w$ of 2.7 µm and a thickness of 1900 Å. The resonators R1 through R5 are arranged so as not to share SAW propagation paths thereof. Further, signal terminals $55_{-1}$ and $55_{-2}$ and ground terminals $55_{-3}$, $55_{-4}$ and $55_{-5}$ are provided on the surface of the filter chip 52. Bonding wires $56_{-1}$ through $56_{-5}$, which are made of Al or Au and have a diameter of 25 µm, are bonded to the terminals $54_{-1}$ through $54_{-5}$ and the terminals $55_{-1}$ through $55_{-5}$. The bonding wire $56_{-3}$ connects the electrode terminals $54_{-3}$ and $55_{-3}$ together. The bonding wire $56_{-4}$ connects the ground terminals $54_{-4}$ and $55_{-4}$ together. The bonding wire $56_{-5}$ connects the ground terminals $54_{-5}$ and $55_{-5}$.

The bonding wires $56_{-3}$ through $56_{-5}$ are as long as 2.0 mm, and functions as inductance elements L1, L2 and L3 shown in FIG. 26.

The ion implantation layers having a thickness of 2200 Å are formed with respect to the series-arm resonators R2 and R4 in the aforementioned method. Alternatively, it is possible to implant ions in surface portions of the filter chip 52 on which the parallel-connection resonators R1, R3 and R5 are formed. Of course, it is possible to execute the heat treatment of the ion implantation layers.

FIG. 27 shows another practical example of the SAW filter according to the present invention. A SAW filter 60 shown in FIG. 27 has a piezoelectric substrate of LiTaO$_3$ (36° Y-cut) having dimensions shown therein. There are arranged, from the input side, a parallel-connection (parallel-arm) resonator Rp1, a series-connection (series-arm) resonator Rs1, a parallel-connection resonator Rp2, a series-connection resonator Rs2 and a parallel-connection resonator Rp3. Each of the resonators has reflectors (shortcircuit type) 62 arranged at opposite sides thereof. Each of the electrodes of the resonators has 50 finger pairs, an aperture length of 180 μm. The reflectors has 50 finger pairs. The period of the comb-type electrodes of the parallel-connection resonators is different from that of the comb-type electrodes of the series-connection resonators. For example, the period of the parallel-arm resonators is 4.39 μm (the pattern width is approximately 1.1 μm (=$\lambda_p$/4) because the ratio of the pattern width and the space is 1:1). The period $\lambda_s$ of the series-connection resonators is 4.16 μm (the pattern width is approximately 1.04 μm (=$\lambda_s$/4).

The ion implantation process and the heat treatment have been performed with respect to surface portions of the piezoelectric substrate 60 on which the series-connection resonators Rs1 and Rs2. Alternatively, it is possible to perform the ion implantation process and the heat treatment with respect to surface portions on which the parallel-connection resonators Rp1, Rp2 and Rp3.

In the aforementioned SAW filters, it is possible to perform the ion implantation process and the heat treatment with respect to both the series-connection resonators and the parallel-connection resonators at different doses of ions to be implanted. In this case, it is possible to very finely adjust the filter characteristic. For example, in FIG. 17, ions are implanted in the surface portions on which the series-connection resonators 5 and 6 are formed at a dose different from that at which ions are implanted in the surface portions on which the parallel-connection resonators 7 and 8 are formed.

Alternatively, it is possible for the surface portions on which the series-connection resonators 5 and 6 are formed to be implanted by a kind of ions different from that of ions which are implanted in the surface portion on which the parallel-connection resonators 7 and 8 are formed. It is also possible to control both the ion kind and the dose.

It is also possible to combine the concept of the ion implantation process directed to varying the surface acoustic velocity with the concept of adjusting the line/space ratio. For example, it is possible to form a SAW filter having the structure shown in FIG. 17 and the structure shown in FIG. 21.

According to the present invention, it is possible to obtain the following advantages.

It is possible to control the SAW propagation speed and the electromechanical coupling factor by the ion implantation process and the subsequent heat treatment independently of the piezoelectric substrate material and the crystal orientation, thus the SAW mode and the temperature coefficient. In an application to SAW filters, it is possible to provide SAW filters having a high Q-value and a high shape factor by the ion implantation process and preferably the heat treatment rather than selection of the piezoelectric substrate material as well as the crystal orientation. In this case, it is possible to finely adjust the filter characteristic by selectively implanting ions in surface portions on which resonators are formed. The fine adjustment of the filter characteristic can be performed so that different kinds of ions can be implanted with respect to different types of resonators. It is also possible to implant ions with respect to different types of resonators at different doses of ions.

By optimizing the thickness of ion implantation layers, it is possible to optimize a desired filter characteristic without increase in the insertion loss.

By setting the line/space ratio of the comb-type electrodes of the parallel-connection resonator to be different from that of the series-connection resonator, it is possible to provide SAW filters having a desired filter characteristic rather than selection of the piezoelectric substrate material as well as the crystal orientation.

The present invention is not limited to the specifically disclosed embodiments, and variations and modifications may be made without departing from the scope of the present invention.

What is claimed is:

1. A method of producing a SAW (Surface Acoustic Wave) device, comprising the steps of:
    a) implanting ions in an entire surface of a piezoelectric member of the SAW device, so that an ion implantation layer is formed therein;
    b) performing a heat treatment of the piezoelectric member, so that a heat-treated ion implantation layer is formed in the entire surface of the piezoelectric member; and
    c) providing an electrode of a comb type resonator on the heat-treated ion implantation layer.

2. A method of producing a SAW (Surface Acoustic Wave) device, comprising the steps of:
    a) implanting ions in an entire surface of a piezoelectric member of the SAW device, so that an ion implantation layer is formed therein;
    b) performing a heat treatment of the piezoelectric member, so that a heat-treated ion implantation layer is formed in the entire surface of the piezoelectric member; and
    c) providing an electrode of a comb type resonator on the heat-treated ion implantation layer,
    wherein said step a) comprises the step of implanting ions so that the heat-treated ion implantation layer has a thickness $h_{ion}$ that satisfies the following condition:

$$0.07 < h_{ion}/\lambda_w < 0.33$$

where $\lambda_w$ denotes the wavelength of a surface acoustic wave.

3. The method as claimed in claim 2, wherein said step a) comprises the step of implanting Ar ions at a dose between $4 \times 10^{13}$ and $7 \times 10^{13}$ ions/cm$^2$.

4. The method as claimed in claim 1, wherein said step a) comprises the step of implanting ions in a state in which a metallic member is provided on a surface of the piezoelectric member opposite said surface portion thereof.

5. The method as claimed in claim 1, wherein said step b) comprises the step of heating the piezoelectric member at a temperature equal to or higher than 350° C. and less than the Curie temperature of the piezoelectric substrate material.

6. The method as claimed in claim 1, wherein said step b) comprises the steps of:
    heating the piezoelectric member at a rate of 3° C. per minute or less;
    keeping the piezoelectric member at a constant temperature during a time between 30 minutes and 1 hour; and
    cooling the piezoelectric member at a rate of 2° C. per minute or less.

7. A method of producing a SAW (Surface Acoustic Wave) device including a first resonator formed on a piezoelectric member, and a second resonator formed on the piezoelectric member, the first resonator having a resonance frequency approximately equal to an anti-resonance frequency of the second resonator, said method comprising the steps of:

a) implanting ions in an entire surface of the piezoelectric member so that an ion implantation layer is formed in the entire surface therein; and b) forming electrodes of a comb type of first and second resonators on the piezoelectric member so that at least one of the first and second resonators is provided on said ion implantation layer.

8. A method of producing a SAW (Surface Acoustic Wave) device including a first resonator formed on a piezoelectric member, and a second resonator formed on the piezoelectric member, the first resonator having a resonance frequency approximately equal to an anti-resonance frequency of the second resonator, said method comprising the steps of:

a) implanting ions in an entire surface of the piezoelectric member so that an ion implantation layer is formed in the entire surface therein; and b) forming electrodes of a comb type of first and second resonators on the piezoelectric member so that at least one of the first and second resonators is provided on said ion implantation layer, wherein:

said step a) comprises the steps of forming a first part and a second part of the ion implantation layer, so that at least one of a dose of ions contained in the first part and a kind of the ions contained therein is different from a dose of ions contained in the second part or a kind of the ions contained in the second part; and said step b) comprises the steps of forming the electrodes so that the first resonator is formed on the first part of said ion implantation layer, and the second resonator is formed on the second part of said ion implantation layer.

9. A method of producing a SAW (Surface Acoustic Wave) device including a first resonator formed on a piezoelectric member, and a second resonator formed on the piezoelectric member, the first resonator having a resonance frequency approximately equal to an anti-resonance frequency of the second resonator, said method comprising the steps of:

a) implanting ions in an entire surface of the piezoelectric member so that an ion implantation layer is formed in the entire surface therein; and b) forming electrodes of a comb type of first and second resonators on the piezoelectric member so that at least one of the first and second resonators is provided on said ion implantation layer, wherein said step a) comprises the step of implanting ions so that the ion implantation layer has a thickness $h_{ion}$ that satisfies the following condition:

$$0.07 < h_{ion}/\lambda_w < 0.33$$

where $\lambda_w$ denotes the wavelength of a surface acoustic wave.

10. The method as claimed in claim 9, wherein said step a) comprises the step of implanting Ar ions at a dose between $4 \times 10^{13}$ and $7 \times 10^{13}$ ions/cm$^2$.

11. The method as claimed in claim 7, further comprising the step c) of performing, before said step b), a heat treatment of the piezoelectric member at a temperature higher than 350° C. and lower than the Curie temperature of the piezoelectric substrate material so that a heat-treated ion implantation layer can be formed.

* * * * *